United States Patent
Sasa et al.

(10) Patent No.: US 8,124,211 B2
(45) Date of Patent: Feb. 28, 2012

(54) OPTICAL RECORDING MEDIUM, SPUTTERING TARGET, AND METHOD FOR MANUFACTURING THE SAME

(75) Inventors: Noboru Sasa, Kawasaki (JP); Yoshitaka Hayashi, Yokohama (JP); Toshishige Fujii, Yokohama (JP); Toshihide Sasaki, Yokohama (JP); Hiroyoshi Sekiguchi, Yokohama (JP); Masayuki Fujiwara, Kawasaki (JP)

(73) Assignee: Ricoh Company, Ltd., Tokyo (JP)

( * ) Notice: Subject to any disclaimer, the term of this patent is extended or adjusted under 35 U.S.C. 154(b) by 295 days.

(21) Appl. No.: 12/521,197

(22) PCT Filed: Mar. 5, 2008

(86) PCT No.: PCT/JP2008/054420
§ 371 (c)(1),
(2), (4) Date: Jun. 25, 2009

(87) PCT Pub. No.: WO2008/126573
PCT Pub. Date: Oct. 23, 2008

(65) Prior Publication Data
US 2010/0055375 A1 Mar. 4, 2010

(30) Foreign Application Priority Data

Mar. 28, 2007 (JP) ................. 2007-084685
Apr. 3, 2007 (JP) ................. 2007-097067
Sep. 4, 2007 (JP) ................. 2007-229432

(51) Int. Cl.
*B32B 3/02* (2006.01)

(52) U.S. Cl. ........... 428/64.1; 428/64.4; 430/270.12
(58) Field of Classification Search .............. None
See application file for complete search history.

(56) References Cited

U.S. PATENT DOCUMENTS

| | | | |
|---|---|---|---|
| 3,971,874 A | 7/1976 | Ohta et al. | |
| 2004/0265532 A1 | 12/2004 | Sasa et al. | |
| 2005/0253210 A1 | 11/2005 | Uno et al. | |
| 2006/0222810 A1 * | 10/2006 | Hayashi et al. | ............. 428/64.4 |
| 2007/0114129 A1 * | 5/2007 | Hayashi et al. | ......... 204/298.12 |
| 2009/0011169 A1 | 1/2009 | Fujii et al. | |

FOREIGN PATENT DOCUMENTS

| | | |
|---|---|---|
| JP | 50-46317 | 4/1975 |
| JP | 51-21780 | 2/1976 |
| JP | 55-28530 | 2/1980 |
| JP | 58-9234 | 1/1983 |
| JP | 59-185048 | 10/1984 |
| JP | 7-25209 | 3/1995 |
| JP | 2656296 | 5/1997 |
| JP | 9-286174 | 11/1997 |

(Continued)

*Primary Examiner* — Elizabeth Mulvaney
(74) *Attorney, Agent, or Firm* — Cooper & Dunham LLP

(57) ABSTRACT

To provide an optical recording medium including a substrate and over the substrate at least a recording layer that can record and reproduce with laser light in a blue wavelength region, wherein the recording layer includes Bi and O as main components, further includes at least any of C and N, and does not include Fe; or an optical recording medium including a substrate and over the substrate at least a recording layer that contains, as main components, Bi oxide, and a simple substance of each of one or more elements M (except Bi, C, and N) that enhance a light absorption function for a recording and reproducing laser light, wherein the optical recording medium can record and reproduce with laser light in a blue wavelength region, is provided.

13 Claims, 3 Drawing Sheets

FOREIGN PATENT DOCUMENTS

| | | |
|---|---|---|
| JP | 2002-133712 | 5/2002 |
| JP | 2003-48375 | 2/2003 |
| JP | 2003-237242 | 8/2003 |
| JP | 2004-79020 | 3/2004 |
| JP | 2005-108396 | 4/2005 |
| JP | 2005-161831 | 6/2005 |
| JP | 2006-116948 | 5/2006 |
| JP | 3802040 | 5/2006 |
| JP | 3810076 | 6/2006 |
| JP | 2006-182030 | 7/2006 |
| JP | 2006-247897 | 9/2006 |
| JP | 2006-248177 | 9/2006 |
| JP | 2007-169779 | 7/2007 |
| WO | WO2004/027770 A1 | 4/2004 |

* cited by examiner

OPTICAL RECORDING MEDIUM, SPUTTERING TARGET, AND METHOD FOR MANUFACTURING THE SAME

TECHNICAL FIELD

This disclosure relates to a WORM (Write Once Read Many) optical recording medium that is capable of high density recording using laser light in the blue wavelength region, and has excellent recording and reproducing properties, particularly an excellent recording sensitivity, and to a sputtering target for forming the recording layer of the optical recording medium, and a method for manufacturing the sputtering target.

BACKGROUND ART

In order to provide an optical recording medium that can record and reproduce at a blue laser wavelength or lower, the development of a blue laser that enables extra high density recording rapidly proceeds, and an optical recording medium compatible with it is developed.

In conventional WORM optical recording media, a recording layer including an organic material is irradiated with laser light to cause a change in refractive index mainly due to decomposition or transformation of the organic material to form recording pits, and the optical constant and decomposition behavior of the organic material used in the recording layer are important factors for forming good recording pits.

Therefore, a material that has optical properties and decomposition behavior suitable for a blue laser needs to be selected as the organic material used in the recording layer of a blue laser compatible WORM optical recording medium.

Conventional WORM optical recording media having high to low polarity are so configured that high reflectance is ensured during non-recorded state and that the organic material is decomposed by laser irradiation to cause a large change in refractive index, thereby a large degree of modulation is obtained, so that the recording and reproducing wavelength is selected to be located at the end of a large absorption band on the long wavelength side.

This is because the end of the large absorption band of the organic material on the long wavelength side is a wavelength region that has a moderate absorption coefficient and provides a large refractive index.

However, a recording material that has the value of optical properties for a blue laser comparable to that of conventional red laser compatible recording materials is not found. This is because, in order to have the absorption band of an organic material near the wavelength of a blue laser, the molecular skeleton needs to be made small, or the conjugated system needs to be shortened, but if so, a decrease in absorption coefficient, that is, a decrease in refractive index, is caused. In other words, many organic materials that have an absorption band near the wavelength of a blue laser exist, and the absorption coefficient can be controlled, but they do not have a large refractive index, so that a large degree of modulation cannot be obtained.

Also, organic dye materials have a poorer stability than inorganic materials, so that they have problems in the storage property and light resistance. Then, the use of an inorganic material in the recording layer is studied for WORM optical recording media compatible with a blue laser.

As a recording layer for a WORM optical recording medium compatible with a blue laser, for example, one using a phase change material similar to that of a rewritable optical recording medium is proposed in Patent Literature 1, but a WORM optical recording medium requires long period storage, and the phase change material has an insufficient storage property.

A method, in which a plurality of layers of inorganic material are laminated and their reaction is used for recording, is also proposed in Patent Literature 2, but one using reaction of a plurality of layers is not suitable for long period storage, because the reaction proceeds with time.

In this connection, the present inventors previously proposed the usefulness of a recording layer that has as a main component an oxide of a metal or semimetal, particularly bismuth oxide, as a WORM optical recording medium that is capable of high density recording even with laser light having a blue wavelength (see Patent Literatures 3 to 6).

On the other hand, there are Patent Literatures 7 and 8 as technologies that are similar to the above previous applications of the present inventors: a recording layer in which Te, O, and further another element are added is disclosed in Patent Literature 7; and one using an incomplete oxide of transition metal is disclosed in Patent Literature 8. In the above Patent Literature 8, although it is assumed that one including an element other than transition metal is also included, however, no specific element other than Al is described, the definition of transition metal is unclear because Zn, Y, and the like may or may not be included, and no detail description other than W and Mo is provided.

Further, there is no specific description of a problem to be solved by the invention, that is, higher sensitivity, in these Patent Literatures 7 and 8.

It can be said that a WORM optical recording medium using oxide for a recording layer is suitable for higher density, because the heat conductivity of the recording layer is low, so that heat interference between recording marks can be suppressed.

When oxide is used for the recording layer, decreasing the degree of oxidation of oxide (increasing the amount of oxygen deficiency) is proposed as a method for further improving the recording property.

Technologies using a material, in which the amount of oxygen is smaller than that of the stoichiometric composition, in the red and infrared wavelength regions include, for example, one using TeOx (0<x<2) (see Patent Literature 9), one including at least one selected from TeOx, GeOx, SnOx, BiOx, SbOx, and TlOx, and at least one of S and Se (see Patent Literature 10), one containing Te and Sb in low oxide GeOx or containing Te and Ge in SbOx (see Patent Literature 11), one using Ni-low oxide expressed by NiOx (see Patent Literature 12), an information recording mode in which In-low oxide is irradiated with laser light to form an image (see Patent Literature 13), and the like.

Also, an invention that relates to low oxide in the red wavelength region and in which an element selected from Sn, In, Bi, Zn, Al, Cu, Ge, and Sb is added to TeOx is disclosed in Patent Literature 14. There is also description on BiOx in the text, and it is described to be effective when Te, Sb, or Ge is added. However, this Patent Literature 14 is an invention using a so-called blackening phenomenon in which the transmittance of light is changed by light irradiation, and an invention of a film having reversibility in which the transmittance of one recorded by blackening is returned to the original transmittance again by light irradiation.

However, there is no description regarding the effect of BiOx in the blue region or no detail description other than a system including TeOx in the above Patent Literature 14.

Further, in all the above Patent Literatures 9 to 14, recording and reproducing are performed in the red or infrared wavelength region, and they are not technologies compatible with a blue laser.

As a technology that relates to a WORM optical recording medium compatible with a blue laser and decreases the degree of oxidation of oxide used as a recording layer (increases the amount of oxygen deficiency), the present inventors propose a WORM optical recording medium including a recording layer including at least Bi oxide and an oxide of M (M is at least one element selected from Mg, Al, Zn, Li, Si, Hf, Sn, Y. and B) as main components on a substrate, wherein the oxygen content in the oxide is smaller than that of the stoichiometric composition (see Patent Literature 15).

In this Patent Literature 15, an additive, which is added to Bi oxide, is contained as oxide, and this method is very effective for improving the recording and reproducing properties of a Bi type recording material, but it cannot be said that the recording sensitivity of the recording layer is sufficient when a further increase in recording speed predicted in the future is considered.

Thus, in related art literatures, there is no disclosure nor suggestion of a technology in which Bi oxide, and a simple substance of each of one or more elements M that enhance a light absorption function for a recording and reproducing laser light are contained in a recording layer, as in the present invention, in order to further improve the recording sensitivity.

Also, the present applicant discloses in Patent Literature 16 and the like that a WORM optical recording medium having a recording layer including Bi, B, and O (oxygen) exhibits good properties, and it can be confirmed to exhibit very excellent recording and reproducing properties.

Besides the above, a WORM optical recording medium having a recording layer including Bi oxide as a main component is also disclosed in Patent Literature 17, however, a system to which carbon and nitrogen are added is not discussed.

Also, although an information recording medium using a recording layer including metal nitride and metal carbide is disclosed in Patent Literatures 18 to 19, it includes metal nitride as a main component, and decomposition of metal nitride is the recording principle, so that it is not reference for the present invention including Bi and O (oxygen) as main components.

On the other hand, there is a trend toward higher density and higher speed in optical discs, and also for conventional DVDs, higher density is achieved by two-layer configuration, and also for higher speed, even media capable of 16×-speed recording have appeared. This trend is also the same in optical discs using a blue LD, and is considered to be directed toward high speed recording, and the development of optical recording media for high speed recording is beginning.

However, the related art does not discuss high speed recording at all. Also, the invention of Patent Literature 17 aims at an improvement in recording and reproducing properties and reliability (reproduction stability, storage stability, and the like), and does not discuss high speed recording. Further, it discusses materials in which various elements X are added to bismuth oxide, but C and N are not included in X, and no specific example in which two or more elements are added to bismuth oxide is illustrated.

Separately, the present inventors propose a target including Bi and Fe as a sputtering target for forming a recording layer including Bi oxide as a main component in a WORM optical recording medium that is capable of high density recording with laser light in the blue wavelength region (350 nm to 500 nm) (see Patent Literature 20).

The sputtering method is widely known as one of gas-phase formation methods for a thin film and is also used in industrial thin film manufacture. In the sputtering method, a film is formed by preparing a target material including the same component as the component of the intended film, and usually, colliding Ar (argon) gas ions generated by glow discharge against this target material to knock out the constituent atoms of the target material to deposit the atoms on a substrate. Particularly, oxide generally has a high melting point, so that a method, such as a vapor deposition method, is not preferable, and high frequency sputtering in which high frequency is applied is often used.

The sputtering method is actually often used in the manufacture process and is also advantageous in throughput. However, when a film including a mixed material of two or more elements is formed, the composition of the target and the composition of the film are often not the same, so that the composition of the target needs to be studied. The structure and nature of the film often differ depending on the form of a compound constituting the target, so that this point also needs to be studied. From the viewpoint of the production cost, a further improvement in the speed of film deposition is also necessary. For an improvement in the speed of film deposition, larger electric power needs to be input, and also in that case, an improvement in the strength of the target is necessary such that the target is not broken.

Besides the above, a method for forming a recording layer containing carbon and Bi, by sputtering in a mixed gas of $CH_4$ or the like and Ar, using a low melting point metal target, such as Bi, is disclosed in Patent Literature 21, but it differs from the present invention including Bi and oxygen as main components.

In an optical recording medium, a highly sensitive recording property in which recording is possible at a low recording power is required in terms of the limit of the power of laser light, durability, power saving performance, and the like. Also, high linear velocity recording for an improvement in the speed of information transfer, with high density recording, are required, but in that case, high linear velocity recording requires a further improvement in recording sensitivity, compared with low linear velocity recording. Also, for compatibility, the optical recording medium needs to be compatible with the entire range of recording linear velocity from low linear velocity to high linear velocity.

[Patent Literature 1] Japanese Patent Application Laid-Open (JP-A) No. 09-286174
[Patent Literature 2] Japanese Patent Application Laid-Open (JP-A) No. 2004-79020
[Patent Literature 3] Japanese Patent Application Laid-Open (JP-A) No. 2005-161831
[Patent Literature 4] Japanese Patent Application Laid-Open (JP-A) No. 2005-108396
[Patent Literature 5] Japanese Patent Application Laid-Open (JP-A) No. 2003-48375
[Patent Literature 6] Japanese Patent Application Laid-Open (JP-A) No. 2006-116948
[Patent Literature 7] Japanese Patent Application Laid-Open (JP-A) No. 2002-133712
[Patent Literature 8] Japanese Patent Application Laid-Open (JP-A) No. 2003-237242
[Patent Literature 9] Japanese Patent Application Laid-Open (JP-A) No. 50-46317
[Patent Literature 10] Japanese Patent (JP-B) No. 1444471
[Patent Literature 11] Japanese Patent (JP-B) No. 1849839
[Patent Literature 12] Japanese Patent (JP-B) No. 2656296

[Patent Literature 13] Japanese Patent Application Laid-Open (JP-A) No. 51-21780
[Patent Literature 14] Japanese Patent Application Publication (JP-B) No. 7-25209
[Patent Literature 15] Japanese Patent Application Laid-Open (JP-A) No. 2006-248177
[Patent Literature 16] Japanese Patent Application Laid-Open (JP-A) No. 2006-247897
[Patent Literature 17] Japanese Patent (JP-B) No. 3802040
[Patent Literature 18] Japanese Patent Application Laid-Open (JP-A) No. 2006-182030
[Patent Literature 19] Japanese Patent (JP-B) No. 3810076
[Patent Literature 20] Japanese Patent Application Laid-Open (JP-A) No. 2007-169779
[Patent Literature 21] Japanese Patent (JP-B) No. 1480945

BRIEF SUMMARY

In an aspect of this disclosure, there is provided an optical recording medium that is capable of recording and reproducing by laser light in the blue wavelength region (350 nm to 500 nm) and is also suitable for recording with high sensitivity and in a wide range of linear velocity from low linear velocity to high linear velocity, and a method for manufacturing the same, as well as a sputtering target for forming the recording layer of the optical recording medium, and a method for manufacturing the sputtering target.

In another aspect, there is provided an optical recording medium that exhibits good recording and reproducing properties with laser light in the blue wavelength region (350 nm to 500 nm), particularly laser light having a wavelength near 405 nm, is capable of high density recording, and has a recording layer having a recording sensitivity higher than conventional articles, and a sputtering target for forming the recording layer of the optical recording medium.

According to other aspects of this disclosure, one or more of the following may be included:

<1> An optical recording medium including: a substrate; and a recording layer over the substrate, the recording layer capable of recording and reproduction of information using laser light in a blue wavelength region, wherein the recording layer comprises Bi and O as main components, comprises at least any of C and N, and does not comprise Fe.

<2> The optical recording medium according to <1>, wherein the recording layer further comprises at least one element X selected from B, Li, Sn, Ge, Sr, Mg, Ba, Ca, Mo, W, Co, Si, In, Ti, Mn, Ga, Zr, Cr, Hf, K, Na, Zn, Ni, Cu, Pd, Ag, P, Ta, Y, Nb, Al, V, Sb, Te, and La series elements.

<3> The optical recording medium according to <2>, wherein the element X is B.

<4> An optical recording medium including: a substrate; and a recording layer over the substrate, the recording layer comprising as main components Bi oxide and a simple substance of each of one or more elements M (except Bi, C, and N) that enhance a light absorption function for a recording and reproducing laser light, wherein the optical recording medium can record and reproduce information using laser light in a blue wavelength region.

<5> The optical recording medium according to <4>, wherein the recording layer further comprises an oxide of the element M.

<6> The optical recording medium according to <5>, wherein the element M is B.

<7> The optical recording medium according to <5>, wherein the element M is at least one selected from Zn, Mg, Ru, Sb, Cr, Be, Co, Pd, V, Te, Ir, Mo, Os, and Ph.

<8> A sputtering target including: Bi and O as main components; and at least any of C and N, wherein the sputtering target does not comprise Fe.

<9> The sputtering target according to <8>, further including at least one element X selected from B, Li, Sn, Ge, Sr, Mg, Ba, Ca, Mo, W, Co, Si, In, Ti, Mn, Ga, Zr, Cr, Hf, K, Na, Zn, Ni, Cu, Pd, Ag, P, Ta, Y, Nb, Al, V, Sb, Te, and La series elements.

<10> The sputtering target according to <9>, wherein the element X is B.

<11> A sputtering target including: Bi oxide; and a simple substance of each of one or more elements M (except Bi, C, and N) that enhance a light absorption function for a recording and reproducing laser light of an optical recording medium, wherein the Bi oxide and the simple substance are main components.

<12> The sputtering target according to <11>, further including an oxide of the element M.

<13> The sputtering target according to <11>, wherein the element M is B.

<14> The sputtering target according to <11>, wherein the element M is at least one selected from Zn, Mg, Ru, Sb, Cr, Be, Co, Pd, V, Te, Ir, Mo, Os, and Ph.

BEST MODE FOR CARRYING OUT THE INVENTION

Optical Recording Medium of First Embodiment

Figure 1:
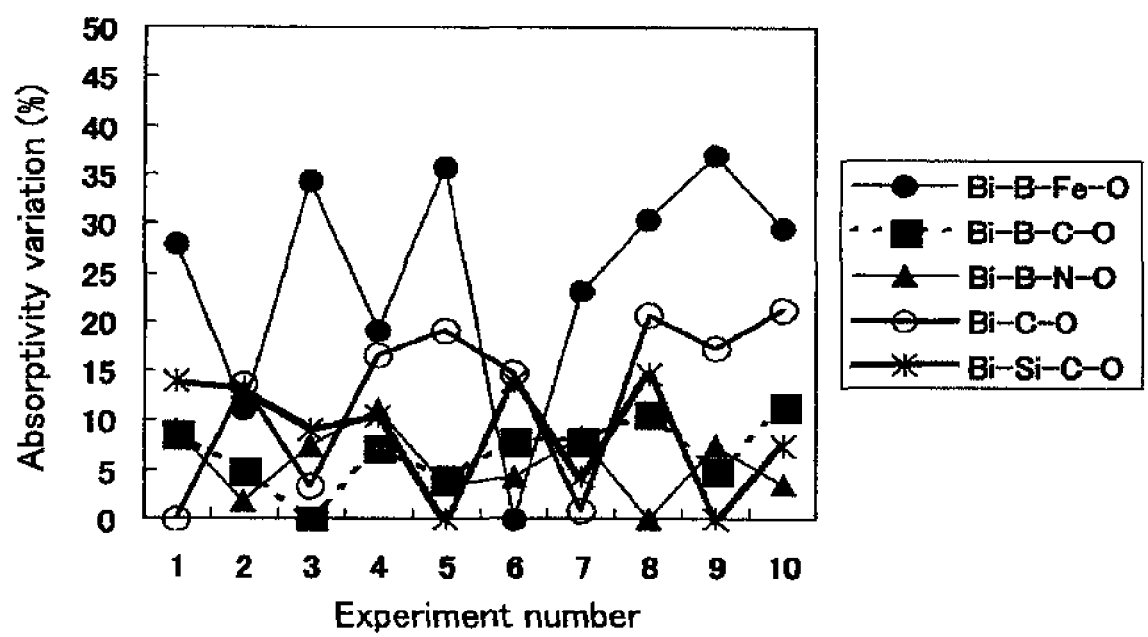
FIG. 1 is a graph showing the result of evaluation in Example A-16.

The optical recording medium of the present invention, in a first embodiment, has at least a recording layer over a substrate, and the recording layer includes Bi (bismuth) and O (oxygen) as main components, further includes C (carbon) and/or N (nitrogen), and does not include Fe.

The main components herein mean that the content (atomic %) of Bi and oxygen combined is highest in the recording layer. The expression "include Bi and oxygen" is used, because while the content of Bi oxide is highest, metal Bi other than Bi oxide may be included in the recording layer.

It is found that if a recording layer including Fe is used, the optical properties and the like of the recording layer are unstable. The cause is not clear, but it is considered that since Fe can have a plurality of valence numbers, the oxidation state easily becomes unstable, as a result, the target is unstable, and variations in the composition of the recording layer are relatively large, and so on. Variations in composition, particularly a relatively low stability of the content of oxygen, cause variations in optical properties. Therefore, there are adverse effects that variations in the properties of the optical recording medium are relatively large, and so on.

On the other hand, for a recording layer that does not include Fe, the optical properties of the recording layer are relatively stable, and the properties of the optical recording medium are also stable, and so on, so that the effect is large.

In practice, as shown in Example A-16 that will be described later, when the light absorptivity, which is one of the optical properties of the recording layer, was examined, it was clear that variations were large when Fe was included, and that variations were small when Fe was not included.

The embodiment of the recording layer is of three types: (1) an embodiment including Bi, O, and C; (2) an embodiment including Bi, O, and N; and (3) an embodiment including Bi, O, C, and N.

The proportion of oxygen in the recording layer is about 30 atomic % to 65 atomic %, preferably 45 atomic % to 62 atomic %, and more preferably about 47 atomic % to 59 atomic %. If the amount of oxygen is large, the stability improves, and the recording property also improves, but the sensitivity worsens. If the amount of oxygen is small, the sensitivity is good, but the reliability, such as storage stability, degrades.

The proportion of Bi is particularly preferably in a range of 20 atomic % to 38 atomic %. For the amount of Bi, since Bi and Bi oxide are essential for recording, if the amount of Bi is small, formation of recording marks is difficult, and the recording property worsens. If the amount of Bi is large, the sensitivity improves, but the reliability, such as storage property, worsens.

As will be described later, the content of C (carbon) is preferably about 1.5 atomic % to 49 atomic %, and the proportion of N (nitrogen) is preferably about 1.5 atomic % to 21 atomic %.

By including Bi and oxygen (substantially Bi oxide) as main components and including a small amount of carbon and/or nitrogen in this manner, an optical recording medium having preferable properties is obtained.

It is considered that in the recording principle of the present invention, Bi and oxygen in Bi oxide are separated by irradiation with laser light to precipitate Bi, so that the optical properties change to perform recording. By including carbon and/or nitrogen at the time, a change in oxygen bonding state, a change in light absorptivity, and the like can be controlled, so that an improvement in sensitivity can be intended. The melting point also changes, so that an improvement in sensitivity can be intended.

Carbon is contained in a recording layer in the form of a simple substance or a compound, or in the form of a mixture thereof. As a method for containing carbon in a recording layer, carbon can be introduced into a recording layer by mixing a simple substance of carbon or carbide in a target and forming a film using the target. It is also possible to introduce carbon into a recording film by mixing a gas including carbon, such as $CO_2$ or $CH_4$, into an Ar gas and forming a film by sputtering. Also, an embodiment including carbon as an organic compound in a recording layer may be used.

Nitrogen is contained in a recording layer in the form of a simple substance or a compound, or in the form of a mixture thereof. As a method for containing nitrogen in a recording layer, nitrogen can be introduced into a recording layer by mixing nitride in a target and forming a film using the target. It is also possible to introduce nitrogen into a recording film by mixing a nitrogen gas into an Ar gas and forming a film by sputtering.

The recording layer preferably further contains at least one element X selected from B, Li, Sn, Ge, Sr, Mg, Ba, Ca, Mo, W, Co, Si, In, Ti, Mn, Ga, Zr, Cr, Hf, K, Na, Zn, Ni, Cu, Pd, Ag, P, Ta, Y, Nb, Al, V, Sb, Te, and La series elements.

The effect is large when about 1.5 atomic % to 18 atomic % of these elements X are included. The amount of Bi nitride is preferably small, and more preferably small to the extent of being almost undetectable.

Preferable embodiments of the recording layer are an embodiment including Bi oxide, X oxide, and X nitride, and an embodiment including Bi oxide, X oxide, and X carbide.

The principle and the like are not clear, but it is considered that since the oxidation state of the element is largely related to recording, the easiness of producing oxide is largely related.

When enthalpy of formation, a measure indicating the easiness with which oxide is produced, is equal to that of Bi, oxide easily releases oxygen to become a simple substance element, increasing the light absorptivity. The melting point also changes, so that an improvement in sensitivity can be intended. Ge, Sn, Li, and the like are elements that apply to this.

Elements, such as B, Li, Na, Mg, K, Ca, and P, have the nature of being easily vitrified by coexisting with bismuth oxide. The mechanism is not clear, but it is possible that the easiness of vitrification is related to an improvement in sensitivity.

For elements that are relatively not easily oxidized, such as Cu, Ag, and Pd, they are not oxidized much, so that oxygen is easily taken from Bi oxide, therefore, the probability that Bi exists as a simple substance metal is high. It is considered that, as a result, Bi and elements, such as Cu, Ag, and Pd, exist as a simple substance metal, so that the sensitivity improves.

It is considered that since La series elements are more easily oxidized than Bi, Bi easily exists as a simple substance metal, contributing to an improvement in sensitivity.

With a film deposition method such as a sputtering method, it is also possible to create an oxygen-excessive state in the film, but in this case, it is considered that oxygen exists in the film in an unstable form, such as entering between lattice points. Also in this case, an improvement in sensitivity is possible by adding an element X, so that the effect is large.

The recording layer preferably includes Bi, B, O, and C. A preferable proportion of each element has been as described above. Since carbide has a high light absorption, it easily absorbs a recording light by existing in the recording layer, so that the sensitivity further improves. Also, by adding B, the phenomenon that Bi is bonded to oxygen, and releases oxygen by recording, occurs more surely. A preferable embodiment of the recording layer is an embodiment including three kinds of compounds: Bi oxide; B oxide; and B carbide.

The recording layer preferably includes Bi, B, O, and N. A is preferable proportion of each element is as described above. Also, by adding B, the phenomenon that Bi is bonded to oxygen, and releases oxygen by recording, occurs more surely.

A preferable embodiment of the recording layer is an embodiment including Bi oxide, B oxide, and B nitride.

As the effects of adding carbon, the following (1) to (3) are considered.

(1) Low jitter can be achieved, so that the recording property improves. (2) The sensitivity improves. (3) The reliability, such as storage stability and reproducing light stability, improves.

It is considered that the roles of carbon providing these effects are to make the crystal phase in the recording marks easily finely divided, to increase the light absorption, to improve the stability of the recording film, and so on.

It is considered that, in the recording layer, when bismuth oxide is phase separated into Bi and bismuth oxide by recording, Bi and bismuth oxide are finely divided without aggregation. In other words, it is considered that crystals in the recording marks are finely divided by addition of carbon, showing a good recording property. Also, since carbon has a high light absorption, the light absorption of the recording layer is high, so that the recording sensitivity improves. Also, a change in the crystal structure of the recording mark portions due to humidity, heat, and light is suppressed, so that the reliability, such as storage stability and reproducing light stability, improves.

If the amount of carbon contained is small, the above-described effects are not obtained; large Bi crystals precipitate in the recording marks, so that a good recording property may not be obtained; the light absorption is insufficient, so that the recording sensitivity is bad; and if large crystals form in the recording marks, the effect of transformation of the crystals and the like is also large. Thus recording reliability easily decreases.

On the other hand, if the amount of carbon is too large, the amount of carbon in the recording marks is large, and the amount of bismuth oxide causing a contrast between recorded portions and unrecorded portions is relatively small, so that contrast is not easily obtained, thereby the recording property degrades. Also, light is absorbed too easily, and unrecorded portions also easily change, so that the storage stability and reproducing light stability degrade. Also, when making a sputtering target, carbon aggregates, and one in which carbon is uniformly dispersed is not easily obtained, so that black spot-like portions, where carbon aggregates, are seen. It is difficult to improve the packing density and strength of such a sputtering target, and also, it is difficult to stabilize the composition of a recording layer formed by using this target.

From these viewpoints, a preferable range of the carbon content is about 1.5 atomic % to 49 atomic % of the entire recording layer.

As one example, WORM optical recording media were manufactured as in Example A-2 described later, except that a composite target including $Bi_2O_3$ and C (carbon) was used and the amount (atomic % with respect to the entire recording layer) of C was changed as shown in Table 1A to form a recording layer, and the reproducing light stability was examined.

The results are shown in Table 1A. For evaluation of the reproducing light stability, after performing a million times of reproduction by applying high frequency superimposition, at a reproducing light power of 0.6 mW, to portions that were recorded as in Example A-2, cases in which the decrease rate of the jitter value was 20% or more were rated as "B", and cases in which the decrease rate of the jitter value was less than 20% were rated as "A."

As seen from Table 1A, if the amount of carbon is small, the stability of the recording mark portions is bad, so that the stability of the recording layer due to a reproducing light degrades. If the amount of carbon is too large, the stability of the unrecorded portions is bad, so that the reproducing light stability degrades.

In order to examine the density of the sputtering target, three were manufactured under the same conditions. Cases in which the average of the filling densities of the targets was 90% or more were rated as "A", and cases in which the average of the filling densities of the targets was less than 90% were rated as "B." The results are shown in Table 1A. For the cases of less than 90%, the strength of the target is relatively weak.

TABLE 1A

| Carbon Amount (atomic %) | Reproduction light stability | Packing density of target |
| --- | --- | --- |
| 0.5 | B | A |
| 1.0 | B | A |

TABLE 1A-continued

| Carbon Amount (atomic %) | Reproduction light stability | Packing density of target |
| --- | --- | --- |
| 1.5 | A | A |
| 5 | A | A |
| 10 | A | A |
| 40 | A | A |
| 49 | A | A |
| 50 | B | B |

As another example, WORM optical recording media were manufactured as in Example A-1 described later, except that a composite target, in which C (carbon) was added to a mixture of $Bi_2O_3$ and $B_2O_3$ having a molar ratio of 8:1, was used to form a recording layer. Carbon was added, with its amount changed according to the amount (atomic % with respect to the entire recording layer) of C shown in Table 2A.

For these WORM optical recording media, the optimum recording power was examined as in Example A-1. The value of the optimum recording power was examined before and after a storage test in an environment of a temperature of 80° C. and a humidity of 85% RH for 500-hours.

The results are shown in Table 2A. For the evaluation criteria, cases in which a value obtained by subtracting the value of the optimum recording power, that is divided by the upper limit recording power of the specification value, from one was 0.1 or more were rated as "A", and cases in which the value was less than 0.1 were rated as "B." The cases in which the value was less than 0.1 indicate that the sensitivity is relatively bad.

TABLE 2A

| Carbon amount (atomic %) | Before storage test | After storage test |
| --- | --- | --- |
| 0.5 | A | B |
| 1.0 | A | B |
| 1.5 | A | A |
| 4 | A | A |
| 10 | A | A |
| 20 | A | A |
| 40 | A | A |
| 49 | A | A |
| 50 | A | B |

It is considered that nitrogen also has the role that, when bismuth oxide is phase separated into Bi and bismuth oxide by recording, Bi and bismuth oxide are finely divided without aggregation. In other words, it is considered that crystals in the recording marks are finely divided by addition of nitrogen, showing a good recording property.

A preferable range of the nitrogen content is about 1.5 atomic % to 21 atomic % of the entire recording layer, as seen from the results in Table 3A below. It is not preferable that the amount of nitrogen is too large because the sensitivity decreases.

As one example, WORM optical recording media were manufactured as in Example A-3 described later, except that a composite target, in which BN was added to a mixture of $Bi_2O_3$ and $B_2O_3$ having a molar ratio of 13:5, was used to form a recording layer. BN was added, with its amount changed according to the amount (atomic % with respect to the entire recording layer material) of N shown in Table 3A.

For these WORM optical recording media, the optimum recording power was examined as in Example A-3. The values of the optimum recording power were examined before and after a storage test in an environment of a temperature of 80° C. and a humidity of 85% for 500-hours.

The results are shown in Table 3A. For the evaluation criteria, cases in which a value obtained by subtracting the value of the optimum recording power, that is divided by the upper limit recording power of the specification value, from one was 0.1 or more were rated as "A", and cases in which the value was less than 0.1 were rated as "B." The cases in which the value was less than 0.1 indicate that the sensitivity is relatively bad.

TABLE 3A

| Nitrogen amount (atomic %) | Before storage test | After storage test |
| --- | --- | --- |
| 0.5 | A | B |
| 1.0 | A | B |
| 1.5 | A | A |
| 5 | A | A |
| 10 | A | A |
| 21 | A | A |
| 22 | B | B |

The thickness of the recording layer is preferably set in a range of 5 nm to 30 nm, more preferably 5 nm to 20 nm. If the thickness is less than 5 nm, a sufficient recording sensitivity is not easily obtained even in a recording layer in which the light absorption function at a recording and reproducing wavelength is improved by the configuration of the present invention as described above. If the thickness is more than 30 nm, the reflectance of the WORM optical recording medium decreases sharply, so that the recording and reproducing properties degrade. Both cases are not preferable.

Optical Recording Medium of Second Embodiment

An optical recording medium of a second embodiment of the present invention will be described below.

Since Bi oxide absorbs light in the blue wavelength region well, among oxides, good recording is easily performed, but a further improvement in recording sensitivity is necessary for higher speed that is predicted in the future.

The points of higher sensitivity in a WORM optical recording medium using Bi oxide for a recording layer are the following two points:

(1) The oxygen content in Bi oxide is made smaller than that of its stoichiometric composition; and (2) A simple substance of each of one or more elements M (except Bi, C, and N) that enhance a light absorption function for a recording and reproducing laser light is contained in Bi oxide.

Japanese Patent (JP-B) No. 2656296 confirms that the recording sensitivity can be improved using a method for making the oxygen content in Bi oxide smaller than that of its stoichiometric composition, but if the oxygen content in Bi oxide is made far smaller than that of its stoichiometric composition, that is, if the content of metal Bi is increased over a certain level, conversely, the recording and reproducing properties, such as recording sensitivity, may worsen. The cause of this is related to the recording principle in the WORM optical recording medium using Bi oxide for its recording layer.

In other words, in a WORM optical recording medium using Bi oxide, having an oxygen content close to the stoichiometric composition, for a recording layer, the following changes are the main recording principle, and phase separation due to nuclei production and growth is considered as the base of recording:

(1) Bi oxide is decomposed by heat due to irradiation with a recording light to produce metal Bi.

(2) microcrystallization of metal Bi occurs.

(3) microcrystallization of Bi oxide occurs.

(4) phase separation of metal Bi and Bi oxide occurs.

Even if the oxygen content of Bi oxide is made smaller than that of the stoichiometric composition, the recording principle is similar to the above, but the absorption coefficient of the recording layer for a recording light can be increased by the presence of metal Bi, so that the recording sensitivity is improved.

In Bi oxide, if the oxygen content is made smaller than that of the stoichiometric composition, crystals of metal Bi easily precipitate, so that a large degree of modulation is obtained also in the blue wavelength region.

However, the melting point of metal Bi is a low temperature of 271° C., and metal Bi is melted by recording, so that phase separation of metal Bi and Bi oxide does not occur easily. Also, the heat conductivity of metal Bi is much higher than that of Bi oxide, so that if the content of metal Bi is over a certain level, the recording and reproducing properties worsen, for example, the recording sensitivity worsens, and the degree of modulation decreases.

Further, the less the oxygen content in Bi oxide is made than that of the stoichiometric composition (that is, the higher the ratio of the presence of metal Bi is), the larger the crystals precipitated are, and the more difficult recording small marks are.

Therefore, when the oxygen content in Bi oxide is made smaller than that of the stoichiometric composition for increased content of metal Bi, it is important that, using Bi oxide for a matrix, metal Bi be dispersed in the matrix or that metal Bi and Bi oxide be uniformly mixed.

It is not preferable that there are points where metal Bi is not uniform and exists locally in a large amount, because a melting mode will be the main part of the recording principle in the places. Also, it is not preferable that there are points where metal Bi is not uniform and exists locally in a large amount, because even irradiation with a reproducing light can cause melting in the places, so that the reproduction stability may decrease significantly.

A method for making the oxygen content in Bi oxide still smaller than that of its stoichiometric composition includes a method for adding an added element to Bi oxide, and in Bi oxide, an oxide of another element should be contained, as shown in Japanese Patent Application Laid-Open (JP-A) No. 2006-248177.

If the oxygen content in Bi oxide is made smaller than that of the stoichiometric composition in the case where the recording layer is formed only of Bi oxide, the proportion of metal Bi increases so that an improvement in recording sensitivity can be expected. However, Bi oxide, which is the matrix, decreases so that metal Bi particles aggregate easily, and a melting mode will be the main part of the recording principle, thereby degrading the recording and reproducing properties.

To avoid this problem, a method for adding in Bi oxide an oxide of another element is effective so as to prevent aggregation of particles of metal Bi even if the proportion of metal Bi has increased. That is, a decreased amount of Bi oxide, which is the matrix, due to an increased proportion of metal Bi is compensated by addition of an oxide of another element.

By this method the oxygen content in Bi oxide can be made still smaller than that of the stoichiometric composition, as compared with the case where the recording layer includes only Bi oxide, which is effective for improved sensitivity.

Also, if, to Bi oxide, an oxide of another element is added to suppress an increase in the amount of crystals precipitated, formation of small marks is good, and higher density is easily achieved. Also, by adding an oxide of another element, the recording marks are stabilized, so that the storage stability improves.

As the main recording principle of a WORM optical recording medium having a recording layer in which in Bi oxide, an oxide of another element is contained, the following (1) to (5) are considered.

(1) Bi oxide is decomposed by heat due to irradiation with a recording light to produce metal Bi.
(2) microcrystallization of metal Bi occurs.
(3) microcrystallization of Bi oxide occurs.
(4) microcrystallization of another oxide occurs.
(5) phase separation of metal Bi, and Bi oxide and/or another oxide occurs.

In the optical recording medium of the second embodiment of the present invention, in Bi oxide, a simple substance of each of one or more elements M (except Bi, C, and N) that enhance a light absorption function for a recording and reproducing laser light is contained in the recording layer to further improve the recording sensitivity, compared with the above related art. While with respect to Bi oxide, NiOx, which is oxide, is added in the above U.S. Pat. No. 2,656,296, the present invention differs largely in that with respect to Bi oxide, element M exists as a simple substance in the recording layer. Also, element M does not include Bi, because the present invention is the same as the related art if element M is Bi. Further, element M does not include C (carbon) and N (nitrogen) to avoid that the present invention is identical to the inventions of other applications of the applicant.

Then, by selecting element M from elements having such a melting point that the elements are not melted by heat due to irradiation with a recording light, and also selecting an element having a large absorption coefficient for a recording and reproducing laser light, an improvement in recording sensitivity can be intended without changing the main part of the recording mode to the melting mode.

A light-heat conversion function in related art is performed by Bi oxide in the case of a WORM optical recording medium using Bi oxide, having an oxygen content close to the stoichiometric composition, for a recording layer, and is performed by metal Bi and Bi oxide in the case of a WORM optical recording medium using Bi oxide, having an oxygen content smaller than that of the stoichiometric composition, for a recording layer, but in the above recording layer, a light-heat conversion function is performed by a simple substance of element M, metal Bi, and Bi oxide, so that the absorption function of the recording layer for a recording light can be improved significantly.

Also, when the ratio of the presence of metal Bi is increased, as is done conventionally, to increase the absorption coefficient of the recording layer, degradation of recording and reproducing properties easily occurs. But in the present invention, the ratio of the presence of metal Bi, which is a cause of degradation of recording and reproducing properties, need not be increased, both the recording sensitivity and the recording and reproducing properties can be intended.

The optical recording medium of the second embodiment of the present invention includes the following first optical recording medium and second optical recording medium.

The first optical recording medium of the present invention has a recording layer that contains, as main components, Bi oxide, and a simple substance of each of one or more elements M (except Bi, C, and N) that enhance a light absorption function for a recording and reproducing laser light. Thus, the recording sensitivity, when using laser light in the blue wavelength region (350 nm to 500 nm), can be improved, compared with conventional WORM optical recording media using Bi oxide for a recording layer.

The main components herein mean that the content (mole %) of combined Bi oxide and a simple substance of each of one or more elements M that enhances a light absorption function for a recording and reproducing laser light is highest in the recording layer. A simple substance of element M refers to a state of being not chemically bonded to an element other than element M.

In the optical recording medium of the present invention, the light absorption function (a light-heat conversion function) is eliminated from Bi oxide, which is the base of the recording principle, or alleviation of the light absorption function is intended, and a simple substance of each of one or more elements M that enhances a light absorption function for a recording and reproducing laser light is added as a component that newly performs the light absorption function.

Conventionally, Bi oxide performs both functions of obtaining the recording and reproducing properties represent by jitter, PRSNR, error rate, the degree of modulation, reproduction stability, storage reliability, and the like, and of improving the recording sensitivity, so that a significant improvement in recording sensitivity, with the recording and reproducing properties being obtained, cannot be desired.

But in the first optical recording medium of the present invention, separate components have the function of obtaining the recording and reproducing properties and the function of improving the recording sensitivity, respectively, so that both of these functions are possible.

Element M added is not particularly largely limited, but an element having a relatively high melting point (for example, 400° C. or more) is preferable in terms of the easiness of making a sputtering target, durability, and the like.

The second optical recording medium of the present invention has a recording layer that contains, as main components, Bi oxide, a simple substance of each of one or more elements M (except Bi, C, and N) that enhance a light absorption function for a recording and reproducing laser light, and an oxide of the element M. Thus, the recording sensitivity, when using laser light in the blue wavelength region (350 nm to 500 nm), can be improved, compared with conventional WORM optical recording media using Bi oxide for a recording layer.

The main components herein mean that the content (mole %) of combined Bi oxide, a simple substance of each of one or more elements M that enhances a light absorption function for a recording and reproducing laser light, and an oxide of the element M is highest in the recording layer.

The difference between the first optical recording medium and the second optical recording medium of the present invention is that an oxide of element M is contained in the recording layer. An improvement in recording sensitivity is provided by a simple substance of each of one or more elements M that enhances a light absorption function for a recording and reproducing laser light, but depending on the amount of element M and the type of element M, if element M exists only as a simple substance, the heat conductivity of the recording layer increases too much, so that adverse effects that the sensitivity worsens and that the degree of modulation decreases can occur. But, if an oxide of element M is contained in the recording layer, as in the second optical recording medium of the present invention, an improvement in recording sensitivity can be intended without impairing the recording and reproducing properties.

Element M added is not particularly largely limited, but an element having a relatively high melting point (for example, 400° C. or more) is preferable in terms of the easiness of making a sputtering target, durability, and the like.

As element M in the first and second optical recording media of the present invention, an element having a value of imaginary part of complex refractive index of 3.0 or more, when its crystal or thin film is irradiated with a recording and reproducing laser light, is used.

For the element M, such a value of the imaginary part of the complex refractive index is not defined, because if element M exists as a simple substance, it has a light absorption function equal to or higher than that of Bi oxide, in almost all solid elements.

However, in order to intend a further improvement in recording and reproducing properties and to suppress the amount of an additive added to Bi oxide to improve the recording sensitivity even in a small amount of the additive, an element having a value of imaginary part of complex refractive index of 3.0 or more, when its crystal or thin film is irradiated with a recording and reproducing laser light, is preferable as element M. If the value of the imaginary part of the complex refractive index of element M added is 3.0 or more, high sensitivity can be achieved without depending on the wavelength of the recording and reproducing laser light.

Such an element is not particularly largely limited, but an element having a relatively high melting point (for example, 400° C. or more) is preferable in terms of the easiness of making a sputtering target, durability, and the like.

Preferably, B (boron) is used as element M in the first and second optical recording media of the present invention.

Boron is an element that has a light absorption function (a value of imaginary part of complex refractive index) equal to or higher than that of Bi oxide, in the form of a simple substance, and provides a remarkable improvement in recording sensitivity in a small addition amount.

With boron, a sputtering target is relatively easily made, and boron has an excellent durability, therefore, it is a preferable added element. Also, a sputtering target to which boron is added has the advantages of having a very high sputtering rate and an excellent productivity.

Preferably, at least one selected from Zn, Mg, Ru, Sb, Cr, Be, Co, Pd, V, Te, Ir, Mo, Os, and Ph is used as an element having a value of imaginary part of complex refractive index of 3.0 or more.

These elements are a group of elements that have a light absorption function (a value of imaginary part of complex refractive index) equal to or higher than that of Bi oxide, in the form of a simple substance, and provide a remarkable improvement in recording sensitivity in a small addition amount. Also, the melting point is relatively high, a sputtering target is relatively easily made, and the durability is excellent, therefore, they are a preferable group of added elements. If the recording and reproducing wavelength is more than 420 nm, the value of the imaginary part of the complex refractive index of the group of elements listed can be less than 3.0, so that these elements are preferably used when the recording and reproducing wavelength is 420 nm or less.

The ratio of the number of atoms of the element M to Bi (element M/Bi) is preferably 0.20 to 0.70. The ratio of the number of atoms herein is simply the ratio of the number of atoms of element M to Bi, and element M and Bi include element M and Bi that exist as a simple substance and element M and Bi that exist as an oxide.

The above range is preferable, because both the recording and reproducing properties and the recording sensitivity can be surely achieved.

If element M/Bi is less than 0.20, the effect of an improvement in sensitivity decreases. Also, if element M/Bi is more than 0.70, the reflectance often decreases significantly, and degradation of the recording and reproducing properties is often remarkable.

Also, the oxygen content of Bi oxide is preferably smaller than that of the stoichiometric composition.

In the present invention, an improvement in recording sensitivity is provided by containing in the recording layer, Bi oxide and a simple substance of each of one or more elements M that enhances a light absorption function for a recording and reproducing laser light, and further, it is preferable that an improvement in sensitivity is intended also by making the oxygen content in Bi oxide smaller than that of the stoichiometric composition.

For oxides, the ratio of an element and oxygen combined is determined, and it is called a stoichiometric composition. For example, for Bi, the state of $Bi_2O_3$, in which Bi atom:oxygen atom=2:3, is a normal form that can be taken as a compound. This ratio of Bi and oxygen is the stoichiometric composition.

The stoichiometric composition differs according to an element that is combined with oxygen, and for example, oxides, such as $MgO$, $Al_2O_3$, $ZnO$, $Li_2O$, $SiO_2$, $HfO_2$, $SnO_2$, $Y_2O_3$, $B_2O_3$, $Fe_2O_3$, $CO_2O_3$, $V_2O_5$, $VO_2$, $V_2O_3$, and $WO_3$, are formed.

The case where the oxygen content is smaller than that of the stoichiometric composition refers to the case where, for $Bi_2O_3$, $0<x<1.5$ holds in $BiO_x$ as Bi oxide.

In the present invention, Bi oxide may be of any compound form, is not limited to an oxide of Bi alone, such as $Bi_2O_3$, and may be, for example, a composite oxide of three elements, such as $BiBO_3$.

For this $BiBO_3$, the stoichiometric composition is Bi:B:O=1:1:3, and that the oxygen content is smaller than that of the stoichiometric composition means that there are atoms that are not oxidized and exist as metal. But if the oxygen content of Bi oxide is made far smaller than that of the stoichiometric composition, melting of metal Bi is dominant, as the recording principle, so that the recording and reproducing properties degrade. Therefore, the oxygen content of Bi oxide is preferably 50% or more of that of the stoichiometric composition so as to effectively cause phase separation by production and growth of nuclei, which is the recording principle of the present invention.

In the optical recording medium of the second embodiment of the present invention, the value of the imaginary part of the complex refractive index is 0.30 or more, and the value of the real part is 2.20 or more, when the recording layer is irradiated with a recording and reproducing laser light. Thereby, in either of a single-layer or multi-layer WORM optical recording medium, the recording sensitivity can be improved without largely decreasing the reflectance of the medium. Also, in the multi-layer WORM optical recording medium, by the value of the real part being 2.20 or more, the transmittance of recording layers through which a recording and reproducing light is transmitted (recording layers other than the recording layer that is located farthest from the recording and reproducing light) can be increased, and the recording and reproducing properties of the recording layer on the far side can be improved. Also, if the value of the complex refractive index of a recording layer is in the above range, high sensitivity can be achieved without depending on the wavelength of a recording and reproducing laser light.

The recording layer that satisfies the above numeric value limitation can be implemented by the recording layer in the optical recording medium of the present invention.

The thickness of the recording layer is preferably in a range of 5 nm to 30 nm, and more preferably 5 nm to 15 nm. If the thickness is less than 5 nm, a sufficient recording sensitivity may not easily be obtained even in the recording layer of the present invention in which a light absorption function for a recording and reproducing laser light is improved. If the thickness is more than 30 nm, the reflectance of the medium decreases sharply, and also the heat conductivity of the media is too high, so that the recording and reproducing properties may degrade.

—Protective Layer—

Next, it is preferable that in the optical recording media according to the first and second embodiments of the present invention, a protective layer (an upper protective layer or a lower protective layer) is provided on both surfaces of the recording layer. These protective layers have functions of suppressing the deformation or breakage of the recording layer and accepting the melting, compositional change, and diffusion of the recording layer. Also, these protective layers usually preferably pass through light with a wavelength for recording and reproducing for increased reflectance, but can also be provided with a light absorption function for the recording and reproducing wavelength, to some extent, to adjust the recording sensitivity.

By providing the protective layers, the influences on deformation of recording marks can be made much smaller than in conventional optical recording media, and also a drastic increase in the influence on such deformation due to increased recording power in high linear velocity recording can be prevented, so that this is effective for improving the high linear velocity recording property. This is also effective for improving the storage stability.

Sulfide is preferable as the materials for the upper and lower protective layers. The reason for this is not clear, but it is considered that by sulfide and the recording layer material being mixed or reacted, and diffused into each other, formation of recording marks is easy and good and is performed at a higher speed, so that the recording sensitivity improves. Also, it is considered that since many sulfides are relatively soft, stress due to deformation of the recording layer that occurs during recording is easily relaxed.

Specific examples include ZnS, CaS, SrS, BiS, GeS, or mixtures thereof. Further, oxide, nitride, or the like may be mixed.

Particularly, in terms of transparency for a recording and reproducing light and productivity, preferable examples are materials including $ZnS.SiO_2$ as a main component. Also, $SiO_2$, $ZrO_2$, $Ta_2O_5$, and $SnO_2$ are preferably included as main components to obtain a sufficient heat insulating effect.

Materials that are relatively hard and low reactive, such as oxide, nitride, and carbide, can also be used as the upper and lower protective layer materials, and are preferable, because after recording marks are formed, their deformation and compositional change do not easily occur, and the heat of the recording layer does not cause decomposition, sublimation, cavitation, or the like.

Specific examples include simple oxide type oxides, such as $Al_2O_3$, $MgO$, $ZrO_2$, $SnO_2$, $Nb_2O_5$, $Ta_2O_5$, $SiO_2$, $Y_2O_3$, $CeO_2$, $ZnO$, $TiO_2$, and $In_2O_3$; oxides, such as composite oxides of the above oxides, and silicate type oxides, such as $2MgO.SiO_2$, $MgO.SiO_2$, $CaO.SiO_2$, $ZrO_2.SiO_2$, $3Al_2O_3.2SiO_2$, $2MgO.2Al_2O_3.5SiO_2$, and $Li_2O.Al_2O_3.4SiO_2$; nitride type materials, such as silicon nitride, aluminum nitride, BN, and TiN; carbide type materials, such as SiC, $B_4C$, TiC, WC, and amorphous carbon; and composite compounds, such as SiON, AlON, SiAlON, TiOC, and SiOC.

Besides the above, fluorides, such as $MgF_2$ and $CaF_2$, can also be used, and borides and the like can also be used because of hardness and high heat conductivity.

Further, organic materials, such as dyes and resins, can also be used as the upper and lower protective layer materials.

The dyes include, for example, polymethine dyes, naphthalocyanine dyes, phthalocyanine dyes, squarylium dyes, chroconium dyes, pyrylium dyes, naphthoquinone dyes, anthraquinone (indanthrene) dyes, xanthene dyes, triphenylmethane dyes, azulene dyes, tetrahydrocholine dyes, phenanthrene dyes, triphenothiazine dyes, azo dyes, formazan dyes, or metal complex compounds thereof.

The resins include, for example, polyvinylalcohol resins, polyvinylpyrrolidone resins, nitrocellulose, cellulose acetate, ketone resins, acrylic resins, polystyrene resins, urethane resins, polyvinylbutyral resins, polycarbonate resins, polyolefin resins, and the like. One of these may be used alone, or two or more of these may be used in combination.

Formation of the first and lower protective layers can be performed by a normal way, for example, by vapor deposition, sputtering, CVD, or coating. In the coating method, the organic material and the like should be dissolved in an organic solvent and applied using a general coating method, such as spraying, roller coating, dipping, or spin coating.

An organic solvent that is used for the application method is not particularly limited, can be selected appropriately according to the purpose, and includes, for example, alcohols, such as methanol, ethanol, and isopropanol; ketones, such as acetone, methyl ethyl ketone, and cyclohexanone; amides such as N,N-dimethylacetamide and N,N-dimethylformamide; sulfoxides such as dimethylsulfoxide; ethers, such as tetrahydrofuran, dioxane, diethyl ether, and ethylene glycol monomethyl ether; esters, such as methyl acetate and ethyl acetate; aliphatic halogenated carbons, such as chloroform, methylene chloride, dichloroethane, carbon tetrachloride, and trichloroethane; Aromatic compounds, such as benzene, xylene, monochlorobenzene, and dichlorobenzene; Cellosolves; hydrocarbons, such as hexane, pentane, cyclohexane, and methylcyclohexane; and the like. One of these may be used alone, or two or more of these may be used in combination.

The upper protective layer is a layer that is provided between the recording layer and the reflective layer, and mainly performs the function of controlling the recording sensitivity and the reflective layer. If the thickness of the upper protective layer is too thin, heat generated in the recording layer is released more than necessary, so that the thickness is preferably set to 10 nm or more. Also, if the thickness of the upper protective layer is thick, heat generated in the recording layer is not easily released, and heat interference between the recording marks increases, so that the thickness is preferably set to 100 nm or less.

The lower protective layer is provided to obtain the storage reliability of the recording layer. That is, the lower protective layer serves to protect the recording layer from the oxygen, moisture, and other gases that permeate the substrate and the cover layer. Therefore, the thickness is preferably 10 nm or more to sufficiently protect the recording layer. However, in terms of productivity, the thickness is preferably set to 100 nm or less.

The optical recording media of the first and second embodiments of the present invention have a layer configuration in which at least a lower protective layer, a recording layer, an upper protective layer, and a reflective layer are sequentially laminated over the substrate. Thereby, an optical recording medium in accordance with the specifications of HD DVD-R that has a good sensitivity and is capable of high linear velocity recording can be implemented. In this layer configuration, recording and reproducing are performed from the substrate side.

Figure 2:
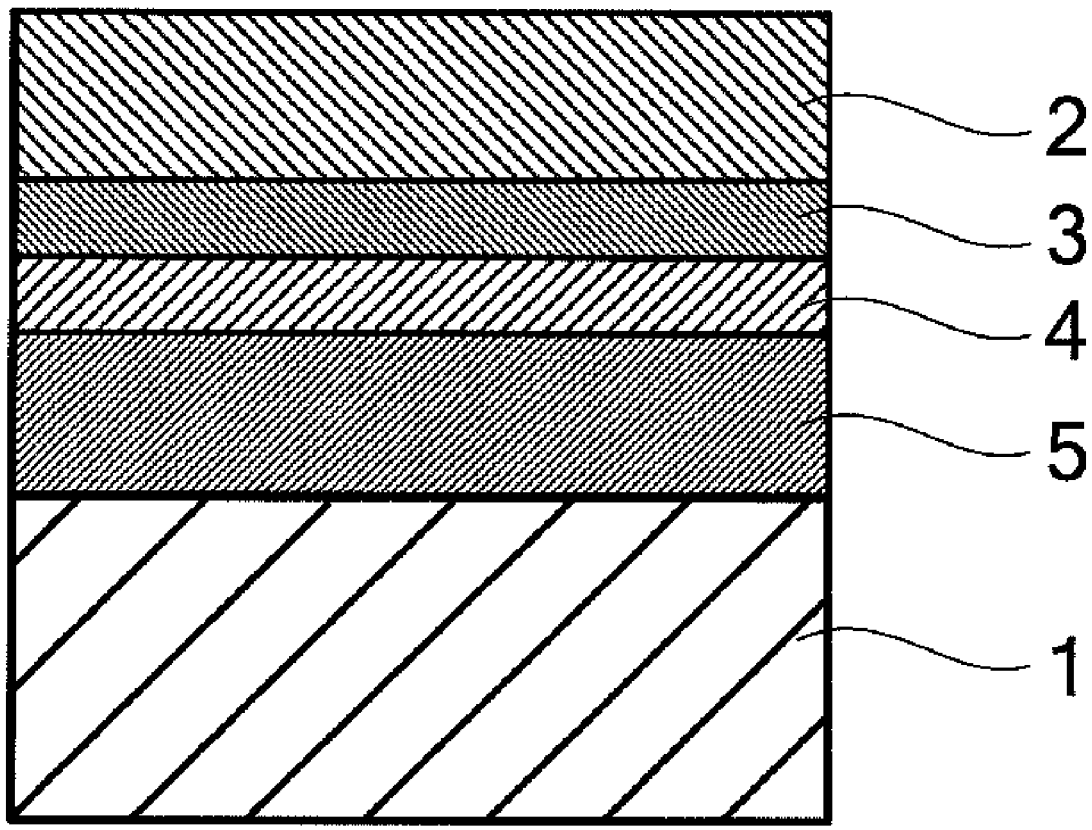
FIG. 2 shows one example of a layer configuration of HD DVD-R, including, in order, a substrate 1, a lower protective layer 5, a recording layer 4, an upper protective layer 3, and a reflective layer 2.

FIG. 2 shows one example of a layer configuration of HD DVD-R, including, in order, a substrate 1, a lower protective layer 5, a recording layer 4, an upper protective layer 3, and a reflective layer 2.

When a high NA lens is used to intend higher density, a layer configuration in which at least a reflective layer, an upper protective layer, a recording layer, a lower protective layer, and a cover layer are sequentially laminated over the substrate is made. Thereby, an optical recording medium in accordance with BD-R specifications that has a good sensitivity and is capable of high linear velocity recording can be implemented. In this layer configuration, recording and reproducing are performed from the cover layer side.

Figure 3:
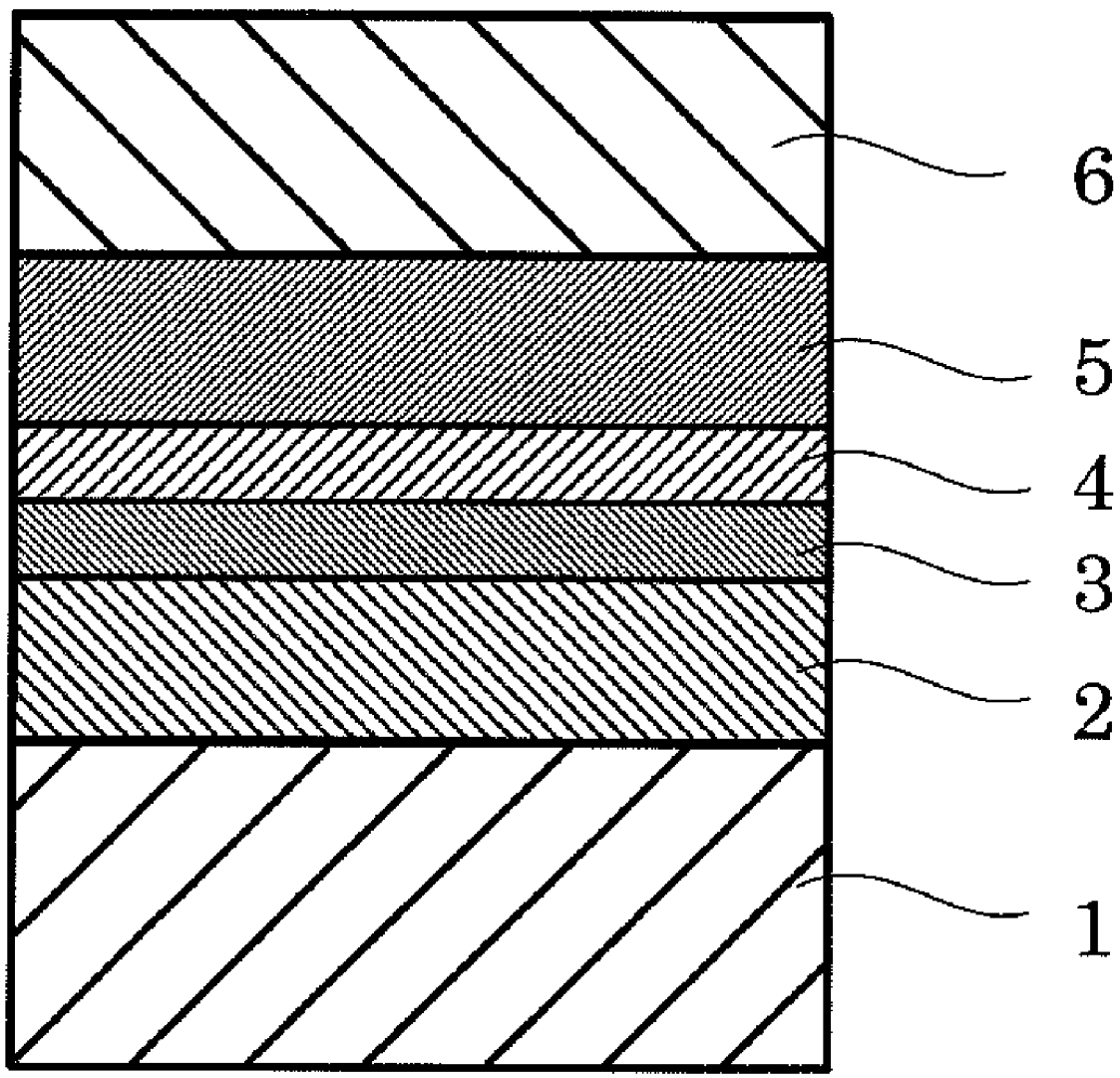
FIG. 3 shows one example of a layer configuration of BD-R, including in order, a substrate 1, a reflective layer 2, an upper protective layer 3, a recording layer 4, a lower protective layer 5, and a cover layer 6.

FIG. 3 shows one example of a layer configuration of BD-R, including in order, a substrate 1, a reflective layer 2, an upper protective layer 3, a recording layer 4, a lower protective layer 5, and a cover layer 6.

In the above layer configuration, the same material may be used or different materials may be used for the upper protective layer and the lower protective layer, and also, each protective layer may have a lamination configuration including two or more layers.

For example, a combination of having a lower protective layer as a two-layer configuration, using a material that includes sulfide for a layer adjacent to the recording layer, and using a layer that does not include sulfide for a layer adjacent to the reflective layer is preferable in terms of sensitivity and storage property.

The optical recording media according to the first and second embodiments of the present invention can record and reproduce with laser light in the blue wavelength region (350 nm to 500 nm), and laser light having a wavelength of 450 nm or less is preferable. Recording and reproducing is possible even by laser light in a wavelength region of more than 500 nm.

Materials of the substrate and the cover layer are not particularly limited, as long as they have excellent thermal and mechanical properties, and also have an excellent light transmission property when recording and reproducing are performed from the substrate side (through the substrate).

Specific examples include polycarbonate, methyl polymethacrylate, amorphous polyolefin, cellulose acetate, polyethylene terephthalate, and the like, and polycarbonate and amorphous polyolefin are preferable.

The thickness of the substrate differs according to applications and is not particularly limited.

When a high NA lens is used to intend high density, the thickness of a portion through which a reproducing light is transmitted needs to be decreased. This is because, with higher NA, the allowable amount of aberration caused by an angle at which the disc surface is displaced from the vertical with respect to the optical axis of the optical pickup (so-called a tilt angle, proportional to the square of the product of the reciprocal of the wavelength of the light source and the numerical aperture of the objective lens) decreases, and this tilt angle is subject to the effect of aberration due to the thickness of the substrate. Therefore, the effect of aberration on the tilt angle is made as small as possible by providing a cover layer that is thinner than a normal substrate, and performing recording and reproducing from the cover layer side. Thereby, higher recording density that exceeds BD-R specifications can be intended.

Further, when recording is performed using near-field light, a thin layer of about several nm to several tens nm is used as the cover layer. This layer is preferable for high density recording, because when it has a high refractive index, light does not spread, and reaches the recording layer, remaining as a small spot. Also, since it becomes thin, a material that is hard and has good abrasion resistance and sliding property is preferably used, and preferable examples include silicon nitride, diamond-like carbon, and the like.

For the reflective layer, for example, metal, such as Al, Al—Ti, Al—In, Al—Nb, Au, Ag, and Cu, semimetal, and alloys thereof can be used. These substances may be used alone or in combination of two or more. In terms of heat conductivity and reflectance, a simple substance metal, such as Ag, Cu, and Al, and alloys thereof are preferably used.

Methods for forming a reflective layer using these materials include, for example, a sputtering method, an ion plating method, a chemical vapor deposition method, a vacuum deposition method, and the like.

When the reflective layer is formed by an alloy, the reflective layer can be made by a sputtering method using the alloy for a target material, and in addition, the reflective layer can also be made by a chip-on-target method (for example, a film is formed with a Cu chip on an Ag target), a co-sputtering method (for example, an Ag target and a Cu target are used).

It is also possible to stack low refractive index layers and high refractive index layers alternately, using material other than metal, to form a multi-layer film to be used as a reflective layer.

The thickness of the reflective layer is preferably in a range of 20 nm to 200 nm, and more preferably in a range of 30 nm to 160 nm. But when the reflective layer is applied to a multi-layer optical recording medium, the lower limit of the reflective layer thickness it not limited to this. If the thickness is thinner than 20 nm, the problems that the desired reflectance is not obtained and that the reflectance decreases during storage, and further the problem that the sufficient recording amplitude is not obtained may arise. If the thickness is thicker than 200 nm, the film deposition surface may be rough, and the reflectance may decrease. This is also not preferable in terms of productivity.

When the reflective layer includes Ag, and a material including S is used for the protective layer, a sulfurization preventing layer for preventing reaction of Ag and S needs to be provided between the reflective layer and the protective layer. As its material, oxide, nitride, carbide, and the like, that have a low light absorption, are preferable, for example, nitride including SiN as a main component, oxide, such as $TiO_2$, and carbide, such as SiC.

The thickness of the sulfurization preventing layer is preferably about 2 nm to 7 nm. If the thickness is thinner than 2 nm, the effect of prevention is not provided due to nonuniformity of the film. If the thickness is thicker than 7 nm, the reflectance and the recording sensitivity may decrease.

A thick environment protection layer is preferably formed on the reflective layer. The material of the environment protection layer is not particularly limited as long as it protects the reflective layer from external force, and it can be selected appropriately according to the purpose and includes, for example, organic materials, inorganic materials, and the like. The organic materials include, for example, thermoplastic resins, thermosetting resins, electron beam curable resins, ultraviolet ray curable resins, and the like. The inorganic materials include, for example, $SiO_2$, $Si_3N_4$, $MgF_2$, $SnO_2$, and the like.

As a method for forming an environment protection layer, application methods, such as a spin coating method and a casting method; a sputtering method, a chemical vapor deposition method, and the like are used, and a spin coating method is preferable among them.

When a thermoplastic resin or thermosetting resin is used for the environment protection layer, it is usually dissolved in a suitable solvent, applied, and dried to form a layer.

When an ultraviolet ray curable resin is used for the environment protection layer, it is usually applied as it is or dissolved in a suitable solvent, and irradiated with ultraviolet rays to be hardened to form a layer. As the ultraviolet ray curable resin, for example, acrylate type resins, such as urethane acrylate, epoxy acrylate, and polyester acrylate, and the like can be used.

These materials may be used alone or used being mixed, and may be formed into not only one layer but also multiple layers.

The thickness of the environment protection layer is preferably 0.1 μm to 100 μm, and more preferably 3 μm to 30 μm.

Also, a substrate may further be attached to the reflective layer or the light transmitting layer surface, or the reflective layer and the light transmitting layer surface may be opposed to each other as inner surfaces to attach two optical recording media.

An ultraviolet ray curing resin layer, an inorganic type layer, and the like may be formed on the substrate mirror-surface side for surface protection and preventing attachment of dust and the like.

The light transmitting layer (the cover layer) is necessary when a high NA lens is used to intend higher density. For example, when higher NA is achieved, the thickness of a portion through which a reproducing light is transmitted needs to be decreased. This is because, with higher NA, the allowable amount of aberration caused by an angle at which the disc surface is displaced from the vertical with respect to the optical axis of the optical pickup (so-called a tilt angle, proportional to the square of the product of the reciprocal of the wavelength of the light source and the numerical aperture of the objective lens) decreases, and this tilt angle is subject to the effect of aberration due to the thickness of the substrate. Therefore, it is necessary that the thickness of the substrate is decreased to make the effect of aberration on the tilt angle as small as possible.

Then, for example, an optical recording medium in which irregularities are formed on a substrate to make a recording layer, a reflective layer is provided on the recording layer, and a light transmissive light transmitting layer (a cover layer) which is a layer that transmits light is further provided on the reflective layer, the optical recording medium being irradiated with a reproducing light from the light transmitting layer side to reproduce the information of the recording layer; and an optical recording medium in which a reflective layer is provided on a substrate, a recording layer is provided on the reflective layer, and a light transmitting layer having a light transmission property is further provided on the recording layer, the optical recording medium being irradiated with a reproducing light from the cover layer side to reproduce the information of the recording layer are proposed (Blu-ray specifications).

In this manner, the optical recording medium is compatible with a higher NA of the objective lens by thinning the light transmitting layer. In other words, a still higher recording density can be intended by providing a thin light transmitting layer, and recording and reproducing from this light transmitting layer side.

Such a light transmitting layer is generally formed by a polycarbonate substrate and an ultraviolet ray curable resin.

Also, a layer for boding the light transmitting layer may be included in the light transmitting layer mentioned in the present invention.

The optical recording media of the first and second embodiments of the present invention can also have the following configurations other than the above-described layer configurations, but configurations are not limited to these, and, for example, the lower protective layer and the upper protective layer may include a plurality of layers.

(a) a substrate/a recording layer/an upper protective layer/a reflective layer (b) a substrate/a lower protective layer/a recording layer/an upper protective layer (c) a substrate/a reflective layer/an upper protective layer/a recording layer/a cover layer (d) a substrate/an upper protective layer/a recording layer/a lower protective layer/a cover layer Further, a multi-layer configuration may be made based on the above configurations (a) to (d). For example, when a two layer configuration is made based on configuration (a), a configuration of a substrate/a recording layer/an upper protective layer/a reflective layer (a translucent layer)/an adhesive layer/a recording layer/an upper protective layer/a reflective layer/a substrate can be made.

Sputtering Target of First Embodiment

Sputtering targets of a first embodiment of the present invention include the following first sputtering target and second sputtering target.

The first sputtering target of the present invention includes Bi (bismuth) and O (oxygen) as main components, further includes C (carbon), and does not include Fe.

The second sputtering target of the present invention includes Bi (bismuth) and O (oxygen) as main components, further includes N (nitrogen), and does not include Fe.

The main components herein mean that the content (atomic %) of Bi and oxygen combined is highest. The expression "include Bi and oxygen" is used, because while the content of Bi oxide is highest, metal Bi other than Bi oxide may be included.

Fe is not included, because a sputtering target including Fe has a relatively low strength and may be broken during film deposition. It is considered that the cause is that while Fe, which is relatively easily oxidized, easily forms oxides, such as $Fe_2O_3$, the coefficient of thermal expansion of these oxides is 10 ($10^{-6}$/° C.), relatively high.

On the other hand, the coefficients of thermal expansion of carbon, SiC, and BN are $1.5 \times 10^{-6}$/° C., $4.3 \times 10^{-6}$/° C., and $3.6 \times 10^{-6}$/° C. respectively, and it is considered that those including carbon and nitrogen have a relatively low coefficient of thermal expansion, and have a high durability against a temperature change during film deposition.

In practice, a Bi—B—C—O target used in Example A-7 and a Bi—B—N—O target used in Example A-8 are not broken during film deposition, but an Bi—B—Fe—O target that is made under similar sintering conditions may be broken under the same film deposition conditions, so that film deposition needs to be performed while lowering the applied electric power during film deposition from 1.2 kW to 0.8 kW. In this way, when Fe is included, the productivity is adversely affected.

The proportion of oxygen in a sputtering target is about 30 atomic % to 65 atomic %, preferably 45 atomic % to 62 atomic %, and more preferably about 47 atomic % to 59 atomic %. If the amount of oxygen is large, the composition of the recording layer formed is relatively stable, and the recording property also improves, but the recording sensitivity worsens. If the amount of oxygen is small, an optical recording medium having a good recording sensitivity can be manufactured, but the strength of the target tends to be relatively weak.

The proportion of Bi is particularly preferably in a range of 20 atomic % to 38 atomic %. For the amount of Bi, since Bi and Bi oxide are essential for recording, if the amount of Bi is small, formation of recording marks is difficult, and the recording property worsens. If the amount of Bi is large, the sensitivity improves, but the reliability, such as storage property, worsens.

As will be described later, the proportion of C (carbon) is preferably about 1.5 atomic % to 49 atomic %, and the proportion of N (nitrogen) is preferably about 1.5 atomic % to 21 atomic %.

By including Bi and oxygen (substantially Bi oxide) as main components and including a small amount of carbon or nitrogen in this manner, an optical recording medium having preferable properties is obtained.

Carbon is contained in the sputtering target in the form of a simple substance or a compound, or in the form of a mixture thereof. By containing carbide, the stability in sintering the target increases, and the productivity of the sputtering target improves.

Nitrogen is contained in the sputtering target in the form of a compound. Nitride can also have the function of an additive for increasing the strength of the target.

The first and second sputtering targets of the present invention preferably further contain at least one element X selected from B, Li, Sn, Ge, Sr, Mg, Ba, Ca, Mo, W, Co, Si, In, Ti, Mn, Ga, Zr, Cr, Hf, K, Na, Zn, Ni, Cu, Pd, Ag, P, Ta, Y, Nb, Al, V, Sb, Te, and La series elements, and more preferably contain at least one element selected from B, Mg, Ba, Ca, Mo, W, Si, Ti, Zr, Cr, Hf, Cu, Ta, Y, Nb, Al, and V.

The effect is large when about 1.5 atomic % to 18 atomic % of these elements X are included. Bi carbide and Bi nitride are unstable, and decompose in sintering so that the amount of Bi carbide and Bi nitride is often small to the extent of being almost undetectable. The amount of Bi carbide and Bi nitride is preferably small for improving the strength of the target, and more preferably small to the extent of being almost undetectable. Preferable embodiments are an embodiment including Bi oxide, X oxide, X nitride, and an embodiment including Bi oxide, X oxide, and X carbide, and an embodiment including Bi oxide and X carbide.

The principle and the like are not clear, but it is considered that carbide and nitride are often used as a sintering aid and an additive for an improvement in strength, and largely related to the strength of the target. Particularly, B, Si, Ti, and Nb have a large effect on an improvement in the strength of the target.

When enthalpy of formation, a measure indicating the easiness with which oxide is produced, is equal to that of Bi, oxide easily releases oxygen to become a simple substance element, increasing the light absorptivity. The melting point also changes, so that an improvement in sensitivity can be intended. Ge, Sn, Li, and the like are elements that apply to this.

Elements, such as B, Li, Na, Mg, K, Ca, and P, have the nature of being easily vitrified by coexisting with bismuth oxide. The mechanism is not clear, but it is possible that the easiness of vitrification is related to an improvement in sensitivity.

For elements that are relatively not easily oxidized, such as Cu, Ag, and Pd, they are not oxidized much, so that oxygen is easily taken from Bi oxide, therefore, the probability that Bi exists as a simple substance metal is high. It is considered that, as a result, Bi and elements, such as Cu, Ag, and Pd, exist as a simple substance metal, so that the sensitivity improves.

It is considered that since La series elements are easily oxidized, compared with Bi, Bi easily exists as a simple substance metal, contributing to an improvement in sensitivity.

The first sputtering target of the present invention preferably includes Bi, B, O, and C. A preferable proportion of each element is as described above. Since $B_4C$ has a high stability, if $B_4C$ is included, the strength of the target improves, so that the effect is large. A recording layer that is formed using this target easily absorbs a recording light due to carbide having a high light absorption existing in the recording layer, so that the sensitivity further improves. Also, by adding B, the phenomenon that Bi is bonded to oxygen, and releases oxygen by recording, occurs more surely.

A preferable embodiment of the first target of the present invention is an embodiment including three kinds of compounds: Bi oxide; B oxide; and B carbide.

The second sputtering target of the present invention preferably includes Bi, B, O, and N. A preferable proportion of each element is as described above. It is effective that B and N are included in the state of BN, because the strength of the target is high. A preferable embodiment of the second target of the present invention is an embodiment including Bi oxide, B oxide, and B nitride.

In the first sputtering target of the present invention, the content of C is set to 1.5 atomic % to 49 atomic % of the total. If C is more than 1.5 atomic %, the recording layer formed is effective for an improvement in sensitivity, because carbon absorbs light. If carbon is more than 49 atomic %, the proportion of bismuth oxide, which is related to recording, decreases, so that the contrast between recorded portions and unrecorded portions is not easily obtained, thereby the recording property degrades. If the amount of carbon is too large, the target is not easily manufactured, and the packing density of the target does not easily improve, so that a target having a good productivity and a high strength cannot be implemented.

The first sputtering target of the present invention is characterized by that direct current sputtering is possible. Direct current sputtering is possible, because the resistivity decreases, particularly when carbon or carbide is contained. It is preferable that direct current sputtering is possible, because the cost of film deposition decreases.

The packing density (relative density) of the first and second sputtering targets of the present invention is 90% or more. Up to a packing density of about 95%, the film deposition rate and the strength of the target improve, with an improvement in packing density. But, at about 95% or more, the strength of the target gradually decreases. The packing density herein refers to the ratio (%) of a density actually measured to a theoretical density when it is assumed that mixed raw materials are mixed in a predetermined ratio.

A method for manufacturing the first sputtering target of the present invention is a method for manufacturing a sputtering target that includes Bi and O as main components, further includes C, and does not includes Fe, the method including the steps of mixing and sintering a bismuth oxide powder and a carbon powder.

In this case, it is preferable that a bismuth oxide powder and a powder of carbide of at least one element selected from Al, B, Ca, Cr, Hf, Mo, Nb, Si, Ta, Ti, V, W, and Zr are mixed and sintered. By using carbide, carbon can be mixed with good stability. Also, since carbon has a high electrical conductivity but also has a high reduction property, Bi oxide can be reduced during sintering, but by mixing stable carbide, manufacture with good reproducibility is possible.

By sintering in a condition in which oxygen is shut out, in an inert atmosphere, or in vacuum, it is possible to prevent carbon from being liberated to escape out of the target. A sintering method, such as a hot press method, is effective, because a mold for molding a target is made of carbon, so that carbon reaches an equilibrium state and does not escape easily.

Also, it is effective that a film is formed by using a sputtering target including Bi, B, and O, and mixing a gas including carbon, such as hydrocarbon, with Ar. If a target that does not contain oxygen is used, a recording layer including Bi and oxygen as main components is not obtained. If a film is deposited using a gas in which oxygen is mixed for supplement of oxygen, mixed hydrocarbon is oxidized to become carbon dioxide and water, therefore, oxygen cannot be mixed.

Also, it is effective that a film is formed in a mixed gas of nitrogen and Ar, using a sputtering target including Bi, B, and O. If a target that does not contain oxygen is used, a recording layer including Bi and oxygen as main components is not obtained. Then, it is possible to form a film using a gas in which oxygen is mixed for supplement of oxygen, but formation of Bi nitride is not preferable, therefore, conditions in which nitride is not formed are preferably used. Also, it is considered that by forming a film in a mixed gas of nitrogen and Ar, separation of Bi and oxygen easily occurs, so that formation of recording marks easily occurs during recording, which is effective for an improvement in recording sensitivity.

Sputtering Target of Second Embodiment

Sputtering targets of a second embodiment of the present invention include the following third sputtering target and fourth sputtering target.

The third sputtering target of the present invention contains, as main components, Bi oxide, and a simple substance of each of one or more elements M (except Bi, C, and N) that enhance the light absorption function of a WORM optical recording medium for a recording and reproducing laser light, and using this, the recording layer of the first optical recording medium of the present invention can be manufactured.

The third sputtering target of the present invention contains, as main components, Bi oxide, a simple substance of each of one or more elements M (except Bi, C, and N) that enhance the light absorption function of a WORM optical recording medium for a recording and reproducing laser light, and an oxide of the element M, and using this, the recording layer of the second optical recording medium of the present invention can be manufactured.

In the third and fourth sputtering targets of the present invention, the element M is preferably an element having a value of imaginary part of complex refractive index of 3.0 or more when its crystal or thin film is irradiated with a recording and reproducing laser light.

The element having a value of imaginary part of complex refractive index of 3.0 or more is at least one selected from Zn, Mg, Ru, Sb, Cr, Be, Co, Pd, V, Te, Ir, Mo, Os, and Ph.

In the third and fourth sputtering targets of the present invention, element M is preferably B.

In the third and fourth sputtering targets of the present invention, the ratio of the number of atoms of the element M to Bi (element M/Bi) is preferably 0.20 to 0.70. Also, the oxygen content of Bi oxide is preferably smaller than that of the stoichiometric composition.

According to the present invention, an optical recording medium that is capable of recording and reproducing by laser light in the blue wavelength region (350 nm to 500 nm) and is also suitable for recording with high sensitivity and in a wide range of linear velocity from low linear velocity to high linear velocity, and a method for manufacturing the same, as well as a sputtering target for forming the recording layer of the optical recording medium, and a method for manufacturing the same can be provided.

According to the present invention, a WORM optical recording medium that exhibits good recording and reproducing properties with laser light in the blue wavelength region (350 nm to 500 nm), particularly laser light having a wavelength near 405 nm, is capable of high density recording, and has a recording layer having a recording sensitivity higher than conventional articles, and a sputtering target for forming the recording layer can be provided.

EXAMPLES

The present invention will further specifically be described below by way of Examples and Comparative Examples, however, the present invention is not limited to these Examples. While examples using laser light having a wavelength of 405 nm are illustrated as Examples, in the recording layer of the present invention, the complex refractive index indicates normal dispersion, and no sharp change in complex refractive index occurs, in the range of 350 nm to 500 nm, so that recording and reproducing can be performed similarly. In other words, when the recording and reproducing wavelength changes in a range of 350 nm to 500 nm, the reflectance and recording sensitivity of the WORM optical recording medium change, but the recording principle does not change, so that similar recording and reproducing are possible.

Example A-1

An AgBi alloy (Bi: 0.5 atomic %) layer having a thickness of 60 nm, a SiN film having a thickness of 4 nm, a $ZnS.SiO_2$ (80 mole %:20 mole %) layer having a thickness of 15 nm, a Bi—B—C—O layer having a thickness of 16 nm, and a $ZnS.SiO_2$ (80 mole %:20 mole %) layer having a thickness of 75 nm were provided in the order by a sputtering method employing a multilayer sputtering solution DVD SPRINTER produced by Oerlikon on a polycarbonate substrate having a thickness of 1.1 mm and a diameter of 120 mm and having a guide groove (groove depth: 21 nm, average groove width: 155 nm, track pitch: 0.32 μm) (product name: ST3000, Teijin-Bayer Polytec Ltd). Then, using an ultraviolet ray curing resin (Nippon Kayaku Co., Ltd., DVD 003), a polycarbonate substrate having a thickness of 75 μm (TEIJIN CHEMICALS LTD., PURE-ACE) was attached on the $ZnS.SiO_2$ layer as a cover layer (a light transmitting layer) to manufacture a WORM optical recording medium having a thickness of about 1.2 mm.

The Bi—B—C—O layer was formed using a composite target of $Bi_2O_3$—$B_2O_3$—C (molar ratio: 8:1:1). Sputtering was performed in an Ar gas.

Recording was performed on this WORM optical recording medium, using optical disc evaluation unit ODU-1000 (wavelength: 405 nm, NA: 0.85) manufactured by Pulstec Industrial Co., Ltd.

When recording was performed at 1× linear velocity (1× speed) in accordance with the specifications of a WORM Blu-ray disc (BD-R Version: 1.1), a jitter value of 4.4% was obtained at an optimum recording power of 4.3 mW.

When recording was performed in a similar manner, with the recording density unchanged, at 4× (a linear velocity four times 1×), and the jitter value was evaluated, a jitter value of 5.5% was obtained at an optimum recording power of 6.7 mW.

These values obtained in Example A-1 were low for jitter and high for sensitivity, compared with those for WORM optical recording media in Comparative Example A-1 and Comparative Example A-2 that will be described later.

Example A-2

A WORM optical recording medium was manufactured as in Example A-1, except that the Bi—B—C—O layer was changed to a Bi—C—O layer, and that a composite target for film deposition was $Bi_2O_3$—C (molar ratio: 1:1).

When recording was performed on the obtained WORM optical recording medium as in Example A-1 at 1× linear velocity, a jitter value of 5.0% was obtained at an optimum recording power of 4.0 mW.

When recording was performed as in Example A-1 at 4× linear velocity, a jitter value of 5.8% was obtained at an optimum recording power of 5.3 mW.

These values obtained in Example A-2 were low for jitter and high for sensitivity, compared with those for WORM optical recording media in Comparative Example A-1 and Comparative Example A-2 that will be described later.

Comparative Example A-1

A WORM optical recording medium was manufactured as in Example A-1, except that the Bi—B—C—O layer was changed to a Bi—O layer, and that a composite target for film deposition was $Bi_2O_3$.

When recording was performed on this WORM optical recording medium as in Example A-1 at 1× and 4× linear velocities, in either cases, optimal conditions were not obtained even by changing the recording power, so that the jitter value remained high, and a low jitter value was not obtained.

Comparative Example A-2

A WORM optical recording medium was manufactured as in Example A-1, except that the Bi—B—C—O layer was changed to a Bi—B—O layer, and that a composite target for film deposition was $Bi_2O_3$—$B_2O_3$ (molar ratio: 6:4).

When recording was performed on this WORM optical recording medium as in Example A-1 at 1× linear velocity, a jitter value of 5.2% was obtained at an optimum recording power of 4.7 mW.

When recording was performed as in Example A-1 at 4× linear velocity, a jitter value of 6.7% was obtained at an optimum recording power of 9.8 mW.

Example A-3

A WORM optical recording medium was manufactured as in Example A-1, except that the Bi—B—C—O layer was changed to a Bi—B—N—O layer, and that a composite target for film deposition was $Bi_2O_3$—$B_2O_3$—BN (molar ratio: 13:5:2).

When recording was performed on this WORM optical recording medium as in Example A-1 at 1× linear velocity, a jitter value of 4.9% was obtained at an optimum recording power of 4.5 mW.

When recording was performed as in Example A-1 at 4× linear velocity, a jitter value of 5.6% was obtained at an optimum recording power of 8.7 mW.

These values obtained in Example A-3 were low for jitter and high for sensitivity compared with those for WORM optical recording media in Comparative Example A-1 and Comparative Example A-2.

Example A-4

A WORM optical recording medium was manufactured as in Example A-1, except that a recording layer (a Bi—C—N—O layer) was formed in a mixed gas of Ar and nitrogen (the flow rate ratio of Ar to nitrogen is 40:10), using a composite target for film deposition including $Bi_2O_3$—C (molar ratio: 1:1).

When recording was performed on this WORM optical recording medium as in Example A-1 at 1× linear velocity, a jitter value of 4.8% was obtained at an optimum recording power of 4.4 mW.

When recording was performed as in Example A-1 at 4× linear velocity, a jitter value of 5.2% was obtained at an optimum recording power of 6.5 mW.

These values obtained in Example A-4 were low for jitter and high for sensitivity, compared with those for WORM optical recording media in Comparative Example A-1 and Comparative Example A-2.

Example A-5

A WORM optical recording medium was manufactured as in Example A-1, except that a recording layer (a Bi—N—O layer) was formed in a mixed gas of Ar and nitrogen (the flow rate ratio of Ar to nitrogen is 40:10), using a target including $Bi_2O_3$.

When recording was performed on this WORM optical recording medium as in Example A-1 at 1× linear velocity, a jitter value of 4.8% was obtained at an optimum recording power of 4.6 mW.

When recording was performed as in Example A-1 at 4× linear velocity, a jitter value of 5.8% was obtained at an optimum recording power of 6.9 mW.

These values of Example A-6 were low for jitter and high for sensitivity, compared with those for WORM optical recording media in Comparative Example A-1 and Comparative Example A-2.

Example A-6

Using a sputtering method that employs a multilayer sputtering solution DVD SPRINTER produced by Oerlikon, a ZnS—$SiO_2$ layer (80:20 mole %) having a thickness of 60 nm, a Bi—B—C—O layer having a thickness of 16 nm, a ZnS—$SiO_2$ layer (80:20 mole %) having a thickness of 20 nm, and an AgBi alloy layer (Bi: 0.5 atomic %) having a thickness of 80 nm were laminated sequentially on a polycarbonate substrate having a thickness of 0.6 mm and having a guide groove (groove depth: 26 nm, average groove width: 200 nm, track pitch: 0.4 μm). The Bi—B—C—O layer was formed using a composite target of $Bi_2O_3$—$B_2O_3$—C (molar ratio: 8:1:1). Sputtering was performed in an Ar gas.

Then, an organic protective layer including an ultraviolet ray curable resin (made by SAN NOPCO LIMITED: Nopcocure 134) and having a thickness of about 5 μm was provided on the AgBi alloy layer by a spin coating method, and a dummy substrate having a thickness of 0.6 mm was attached on the organic protective layer with the ultraviolet ray curable resin to manufacture a WORM optical recording medium.

Recording was performed on this WORM optical recording medium, using optical disc evaluation unit ODU-1000

(wavelength: 405 nm, NA: 0.65) manufactured by Pulstec Industrial Co., Ltd., at a recording density in accordance with HD DVD-R specifications (DVD Specifications for High Density Recordable Disc (HD DVD-R) Version 1.0), and at 1× (1× speed) linear velocity.

As a result, the value of PRSNR was 29.1 at an optimum recording power of 7.6 mW.

Further, when recording was performed, with the recording density unchanged, and with the linear velocity during recording set to 4× (quadruple-speed), the value of PRSNR was 20.4 at an optimum recording power of 13.4 mW.

Comparative Example A-3

A WORM optical recording medium was manufactured as in Example A-6, except that the Bi—B—C—O layer was changed to a Bi—B—O layer, and that a composite target for film deposition was $Bi_2O_3$—$B_2O_3$ (molar ratio: 6:4).

When recording was performed on this WORM optical recording medium as in Example A-6 at 1× linear velocity, the value of PRSNR was 24 at an optimum recording power of 8.8 mW.

Further, when recording was performed as in Example A-6, with the linear velocity during recording set to 4× (quadruple-speed), the value of PRSNR was 19.8 at an optimum recording power of 17.6 mW.

Example A-7

Powders of $Bi_2O_3$, $B_2O_3$, and $B_4C$ were weighed in a molar ratio of 76.4:11.8:11.8 in such a condition that no moisture adsorption occur, mixed, further dry mixed in a ball mill for one hour, and fired at 500° C. for one hour.

Subsequently, after being dry mixed in the ball mill for one hour, this mixed powder was pressure molded at 150 MPa, and hot press fired in the atmosphere at 650° C. for five hours to manufacture a sputtering target. The target had a diameter of 200 mm and a thickness of 6 mm.

This target was bonded to a backing plate of oxygen-free copper by bonding using a low melting point metal to obtain a sputtering target. The packing density of this target was 84%.

Example A-8

Powders of $Bi_2O_3$, $B_2O_3$, and BN were weighed in a molar ratio of 65:25:10 in such a condition that no moisture adsorption occur, mixed, further dry mixed in a ball mill for one hour, and fired at 500° C. for one hour.

Subsequently, after being dry mixed in the ball mill for one hour, this mixed powder was pressure molded at 150 MPa, and hot press fired in the atmosphere at 650° C. for five hours to manufacture a sputtering target. The target had a diameter of 200 mm and a thickness of 6 mm.

This target was bonded to a backing plate of oxygen-free copper by bonding using a low melting point metal to obtain a sputtering target. The packing density of this target was 88%.

Example A-9

Powders of $Bi_2O_3$ and SiC were weighed in such a condition that no moisture adsorption occur, mixed such that the molar ratio of $Bi_2O_3$ to SiC was 2:1, then, dry mixed in a ball mill for one hour, and fired at 700° C. for one hour.

Subsequently, after being dry mixed in the ball mill for one hour, this mixed powder was pressure molded at 150 MPa, and hot press fired in the atmosphere at 750° C. for five hours to manufacture a sputtering target. The target had a diameter of 200 mm and a thickness of 6 mm.

This target was bonded to a backing plate of oxygen-free copper by bonding using a low melting point metal to obtain a sputtering target. The packing density of this target was 97%.

Example A-10

Powders of $Bi_2O_3$ and TiC were weighed in such a condition that no moisture adsorption occur, mixed such that the molar ratio of $Bi_2O_3$ to TiC was 2:1, then, dry mixed in a ball mill for one hour, and fired at 700° C. for one hour.

Subsequently, after being dry mixed in the ball mill for one hour, this mixed powder was pressure-molded at 150 MPa, and hot press-fired in the atmosphere at 750° C. for five hours to manufacture a sputtering target. The target had a diameter of 200 mm and a thickness of 6 mm.

This target was bonded to a backing plate of oxygen-free copper by bonding using a low melting point metal to obtain a sputtering target. The packing density of this target was 94%.

Example A-11

Powders of $Bi_2O_3$ and NbC were weighed in such a condition that no moisture adsorption occur, mixed such that the molar ratio of $Bi_2O_3$ to NbC was 2:1, then, dry mixed in a ball mill for one hour, and fired at 700° C. for one hour.

Subsequently, after being dry mixed in the ball mill for one hour, this mixed powder was pressure molded at 150 MPa, and hot press fired in the atmosphere at 750° C. for five hours to manufacture a sputtering target. The target had a diameter of 200 mm and a thickness of 6 mm.

This target was bonded to a backing plate of oxygen-free copper by bonding using a low melting point metal to obtain a sputtering target. The packing density of this target was 86%.

Example A-12

A WORM optical recording medium having a thickness of about 1.2 mm was manufactured as in Example A-1, except that a Bi—B—C—O layer was formed using the sputtering target manufactured in Example A-7.

When recording was performed on this WORM optical recording medium as in Example A-1 at 1× linear velocity, a jitter value of 4.2% was obtained at an optimum recording power of 4.5 mW.

When recording was performed as in Example A-1 at 4× linear velocity, and the jitter value was evaluated, a jitter value of 5.3% was obtained at an optimum recording power of 7.1 mW.

Example A-13

A WORM optical recording medium was manufactured as in Example A-1, except that a Bi—Si—C—O layer was formed using the sputtering target manufactured in Example A-9.

When recording was performed on this WORM optical recording medium as in Example A-1 at 1× linear velocity, a jitter value of 5.2% was obtained at an optimum recording power of 5.0 mW.

When recording was performed as in Example A-1 at 4× linear velocity, a jitter value of 5.8% was obtained at an optimum recording power of 7.3 mW.

Example A-14

A WORM optical recording medium was manufactured as in Example A-1, except that a Bi—Ti—C—O layer was formed using the sputtering target manufactured in Example A-10.

When recording was performed on this WORM optical recording medium as in Example A-1 at 1× linear velocity, a jitter value of 4.8% was obtained at an optimum recording power of 5.1 mW.

When recording was performed as in Example A-1 at 4× linear velocity, a jitter value of 6.3% was obtained at an optimum recording power of 6.3 mW.

Example A-15

A WORM optical recording medium was manufactured as in Example A-1, except that a Bi—Nb—C—O layer was formed using the sputtering target manufactured in Example A-11.

When recording was performed on this WORM optical recording medium as in Example A-1 at 1× linear velocity, a jitter value of 4.5% was obtained at an optimum recording power of 4.1 mW.

When recording was performed as in Example A-1 at 4× linear velocity, a jitter value of 6.4% was obtained at an optimum recording power of 5.9 mW.

Example A-16

Variations in light absorptivity were compared for recording layers that were formed in an Ar gas, using sputtering targets having compositions of Bi—C—O, Bi—B—C—O, Bi—B—N—O, Bi—Si—C—O, and Bi—B—Fe—O (control), respectively. The wavelength of light was 405 nm, and as samples measured, those in which a recording layer having a thickness of 13 nm was formed on a polycarbonate substrate with no groove and in which a ZnSSiO$_2$ film having a thickness of 20 nm was formed on the recording layer were used. Film deposition was performed under the same conditions, except that the time from placement in a vacuum chamber for film deposition until the start of formation of a recording layer was randomly selected and set from 0 second to 60 seconds. Then, 10 kinds of samples assigned experiment numbers 1 to 10 were manufactured for each target.

Light was entered from the front side of a film, and light absorptivity was measured by a photometer. Further, in order to examine variations in absorptivity, absorptivities which were measured on a plurality of dates and times respectively were standardized on the lowest absorptivity to examine respective variations. Variations in absorptivity (%) were calculated using the equation:

$$\text{variations (\%)} = \{(\text{the obtained absorptivity}) - (\text{minimum absorptivity})\} \times 100 / (\text{minimum absorptivity})$$

The results are shown in FIG. 1, and large numbers for variations indicate that variations in absorptivity are large. It was found that there was difference between samples that included Fe and samples that did not include Fe, and that the samples that did not include Fe had small variations.

The Bi—B—C—O target was one used in Example A-7, the Bi—B—N—O target was one used in Example A-8, the Bi—Si—C—O target was one used in Example A-9, and as the Bi—C—O target and the Bi—B—Fe—O target, those manufactured as follows were used.

<Bi—C—O Target>

Powders of Bi$_2$O$_3$ and C (carbon) were weighed in a molar ratio of 1:1 in such a condition that no moisture adsorption occur, mixed, further dry mixed in a ball mill for one hour, and fired at 750° C. for one hour.

Subsequently, after being dry mixed in the ball mill for one hour, this mixed powder was pressure molded at 150 MPa, and hot press fired in the atmosphere at 780° C. for five hours to manufacture a sputtering target. The target had a diameter of 200 mm and a thickness of 6 mm. This target was bonded to a backing plate of oxygen-free copper by bonding using a low melting point metal to obtain a sputtering target.

<Bi—B—Fe—O Target>

A sputtering target was obtained as in Example A-7, except that powders of Bi$_2$O$_3$, B$_2$O$_3$, and Fe$_2$O$_3$ were used in a molar ratio of 65:30:5.

Example B-1

Using a sputtering method that employs a multilayer sputtering solution DVD SPRINTER produced by Oerlikon, a lower protective layer including ZnS—SiO$_2$ (80 mole %:20 mole %) and having a thickness of 60 nm, a recording layer having a thickness of 10 nm, and an upper protective layer including ZnS—SiO$_2$ (80:20 mole %) and having a thickness of 20 nm were laminated sequentially on a polycarbonate substrate having a guide groove (groove depth: 28 nm, track pitch: 0.40 μm, average groove width: 0.20 μm).

The recording layer was formed using a sputtering target in which Bi$_2$O$_3$, B$_2$O$_3$, and B (boron) were mixed in a ratio of 54.7:19.0:26.3 (mole %) and fired.

This sputtering target was a sputtering target that satisfied the conditions of the present invention.

Then, on the upper protective layer, an Ag reflective layer having a thickness of 60 nm was provided by a sputtering method, and an organic protective layer including an ultraviolet ray curable resin (made by SAN NOPCO LIMITED, Nopcocure 134) and having a thickness of about 5 μm was further provided by a spin coating method to manufacture a WORM optical recording medium in Example B-1.

When the above recording layer was quantitatively analyzed by RBS (Rutherford Backscattering Spectrometry), it was confirmed that the target and the recording layer had an equal composition ratio.

In other words, the recording layer was a recording layer that satisfied the conditions of the present invention in which boron was added to Bi oxide as an element that enhanced a light absorption function for a recording and reproducing laser light.

Also, the ratio of the number of atoms of B to Bi (B/Bi) was about 0.59, so that the recording layer was a recording layer that satisfied the conditions of the present invention.

Further, when the composition of the recording layer in the thickness direction was quantitatively analyzed by XPS (X-ray Photoelectron Spectroscopy), it was confirmed that Bi existed as oxide and metal Bi.

Accordingly, in the recording layer of this example, the oxygen content of Bi oxide, a main component, was smaller than that of the stoichiometric composition, so that the conditions of the present invention were satisfied.

For the values of the complex refractive index of the recording layer near 405 nm, the real part was 2.35, and the imaginary part was 0.40, so that the recording layer of this example satisfied the conditions of the present invention.

Recording in accordance with HD DVD-R specifications (DVD Specifications for High Density Recordable Disc (HD DVD-R) Version 1.0) was performed on the above WORM optical recording medium, using optical disc evaluation unit ODU-1000 (wavelength: 405 nm, NA: 0.65) manufactured by Pulstec Industrial Co., Ltd. The recording speed was 6.61 m/s.

As a result, excellent recording with a degree of modulation of 50%, PRSNR (Partial Response Signal to Noise Ratio) of 30, and PI error of 20 was implemented at a recording power of 6.5 mW.

Comparative Example B-1

A WORM optical recording medium was manufactured as in Example B-1, except that a recording layer was formed using a sputtering target in which $Bi_2O_3$ and $B_2O_3$ were mixed in a ratio of 2:1 (molar ratio) and fired (that is, a target in which B did not exist as a simple substance), and recording in accordance with HD DVD-R specifications was performed as in Example B-1.

As a result, excellent with a degree of modulation of 60%, PRSNR of 25, and PI error of 20 was implemented, but the recording power was 8.5 mW, so that the sensitivity worsened by about 2 mW, compared with Example B-1.

However, the above properties of the WORM optical recording medium manufactured in this Comparative Example B-1 met HD DVD-R specifications well in all evaluation items including recording sensitivity, meaning that the properties of the medium in this Comparative Example B-1 were not bad, and that the present invention was more excellent.

Example B-2

Using a sputtering method that employs a multilayer sputtering solution DVD SPRINTER produced by Oerlikon, an Ag reflective layer having a thickness of 60 nm, an upper protective layer including $ZnS$—$SiO_2$ (80 mole %:20 mole %) and having a thickness of 20 nm, a recording layer having a thickness of 10 nm, and a lower protective layer including $ZnS$—$SiO_2$ (80 mole %:20 mole %) and having a thickness of 60 nm were laminated sequentially on a polycarbonate substrate having a guide groove (groove depth: 20 nm, track pitch: 0.32 μm, average groove width: 0.155 μm).

The recording layer was formed using a sputtering target in which $Bi_2O_3$, $B_2O_3$, and B were mixed in a ratio of 54.7:19.0:26.3 (mole %) and fired.

This sputtering target was a sputtering target that satisfied the conditions of the present invention.

Then, a cover layer including an ultraviolet ray curing resin and having a thickness of 0.1 mm was formed on the lower protective layer by a spin coating method to obtain a WORM optical recording medium.

When this recording layer was quantitatively analyzed by the RBS method, it was confirmed that the target and the recording layer had an equal composition ratio.

In other words, the recording layer was a recording layer that satisfied the conditions of the present invention in which boron was added to Bi oxide as an element that enhanced a light absorption function for a recording and reproducing laser light.

Also, the ratio of the number of atoms of B to Bi (B/Bi) was about 0.59, so that the recording layer was a recording layer that satisfied the conditions of the present invention.

Further, when the composition of the recording layer in the thickness direction was quantitatively analyzed by X-ray Photoelectron Spectroscopy, it was confirmed that Bi existed as oxide and metal Bi.

Accordingly, in the recording layer of this example, the oxygen content of Bi oxide, a main component, was smaller than that of the stoichiometric composition, so that the conditions of the present invention were satisfied.

For the values of the complex refractive index of the recording layer near 405 nm, the real part was 2.35, and the imaginary part was 0.40, so that the recording layer of this example satisfied the conditions of the present invention.

Recording in accordance with BD-R specifications (System Dscription Blu-ray Disc Recordable Format Part1 Basic Format Specifications) was performed on the above WORM optical recording medium, using optical disc evaluation unit ODU-1000 (wavelength: 405 nm, NA: 0.85) manufactured by Pulstec Industrial Co., Ltd. The recording speed was 19.67 m/s (corresponding to 4× recording).

As a result, excellent recording with a degree of modulation of 50% and jitter of 5.5% was implemented at a recording power of 6.0 mW.

Comparative Example B-2

A WORM optical recording medium was manufactured as in Example B-2, except that a recording layer was formed using a sputtering target in which $Bi_2O_3$ and $B_2O_3$ were mixed in a ratio of 2:1 (molar ratio) and fired (that is, a target in which B did not exist as a simple substance), and recording in accordance with BD-R specifications was performed as in Example B-2.

As a result, good recording with a degree of modulation of 62% and jitter of 5.7% was implemented, but the recording power was 7.8 mW, so that the sensitivity worsened by about 1.8 mW, compared with Example B-2.

However, the above properties of the WORM optical recording medium manufactured in this Comparative Example B-2 met BD-R specifications well in all evaluation items including recording sensitivity, meaning that the properties of the medium in this Comparative Example B-2 were not bad, and that the present invention was more excellent.

Examples B-3 to B-12

Using a sputtering method that employs a multilayer sputtering solution DVD SPRINTER produced by Oerlikon, a lower protective layer including $ZnS$—$SiO_2$ (80 mole %:20 mole %), a recording layer, and an upper protective layer including $ZnS$—$SiO_2$ (80 mole %:20 mole %) and having a thickness of 20 nm were laminated sequentially on a polycarbonate substrate having a guide groove (groove depth: 28 nm, track pitch: 0.40 μm, average groove width: 0.20 μm). The thickness of the lower protective layer and the recording layer was adjusted such that the reflectance of the WORM optical recording medium was 14% to 18%. The variation range of the thickness of the lower protective layer was 40 to 60 nm.

The recording layer was formed using a sputtering target in which in a mixture of $Bi_2O_3$ and an oxide of element M listed in Table 1B being constant in 2:1 (molar ratio), added element M listed in Table 1B was further mixed in a range of 1:1 to 2:1 (molar ratio) and the mixture was fired.

These sputtering targets were sputtering targets that satisfied the conditions of the present invention.

Then, on the upper protective layer, an Ag reflective layer having a thickness of 60 nm was provided by a sputtering method, and an organic protective layer including an ultraviolet ray curable resin (made by SAN NOPCO LIMITED, Nopcocure 134) and having a thickness of about 5 μm was further provided by a spin coating method to obtain WORM optical recording media in Examples B-3 to B-12.

When the above each recording layer was quantitatively analyzed by the RBS method, it was confirmed that the target and the recording layer had an equal composition ratio.

In other words, the recording layers were recording layers that satisfied the conditions of the present invention in which an element in Table 1 was added to Bi oxide as an element that enhanced a light absorption function for a recording and reproducing laser light.

Also, every ratio of the number of atoms of added element M in Table 1B to Bi (element M/Bi) satisfied the conditions of the present invention.

Further, when the composition of each recording layer in the thickness direction was quantitatively analyzed by X-ray Photoelectron Spectroscopy, it was confirmed that Bi existed as oxide and metal Bi.

Accordingly, in all the recording layers of Examples B-3 to B-12, the oxygen content of Bi oxide, a main component, was smaller than that of the stoichiometric composition, so that the conditions of the present invention were satisfied.

It was confirmed that for all the values of the complex refractive index of each recording layer near a wavelength of 405 nm, the real part was 2.20 or more, and the imaginary part was 0.30 or more, so that the recording layers of Examples B-3 to B-12 satisfied the conditions of the present invention.

Also, the value of the imaginary part of the complex refractive index of a crystal of each added element M near a wavelength of 405 nm is shown in Table 1B, and every each added element M satisfied the conditions of the present invention.

Recording in accordance with HD DVD-R specifications was performed on the above each WORM optical recording medium as in Example B-1.

As a result, excellent recording with a degree of modulation of 45% or more, PRSNR of 23 or more, and PI error of 50 or less was implemented at each recording sensitivity shown in Table 1B, for all Examples B-3 to B-12.

Photoelectron Spectroscopy, it was confirmed that elements M listed in the Table 1B existed almost as oxide for all comparative examples.

Comparative Examples B-3 to B-12 and Examples B-3 to B-12 can be compared and contrasted, because recording layers in a comparative example and an example having the same number include the same element.

Recording in accordance with HD DVD-R specifications was performed on the above each WORM optical recording medium as in Example B-1.

As a result, excellent recording with a degree of modulation of 50% or more, PRSNR of 20 or more, and PI error of 70 or less was implemented at each recording sensitivity shown in Table 1B, for all Comparative Examples B-3 to B-12.

But, when Examples B-3 to B-12 and Comparative Examples B-3 to B-12 having the same number were contrasted, the sensitivity of Comparative Examples B-3 to B-12 worsened by about 2 mW, compared with Examples B-3 to B-12.

However, the above properties of the WORM optical recording media manufactured in these Comparative Examples B-3 to B-12 met HD DVD-R specifications well in all evaluation items including recording sensitivity, meaning that the properties of the media in these Comparative Examples B-3 to B-12 were not bad, and that the present invention was more excellent.

Example B-13

A WORM optical recording medium was manufactured as in Example B-2, except that a recording layer was formed using a target in which $Bi_2O_3$ and Cu were mixed in a ratio of 1:1 (molar ratio) and fired, and recording in accordance with BD-R specifications was performed as in Example B-2.

As a result, good recording with a degree of modulation of 55% and jitter of 5.5% was implemented at a recording power of 5.8 mW.

It was confirmed that the value of the imaginary part of the complex refractive index of the Cu crystal near a wavelength

TABLE 1B

| Added element M | Value of imaginary part of complex refractive index | | Recording sensitivity (mW) | | Recording sensitivity (mW) |
|---|---|---|---|---|---|
| Zn | 3.00 | Ex. B-3 | 6.5 | Comp. Ex. B-3 | 8.6 |
| Mg | 3.66 | Ex. B-4 | 6.3 | Comp. Ex. B-4 | 8.7 |
| Sb | 3.30 | Ex. B-5 | 6.4 | Comp. Ex. B-5 | 8.5 |
| Cr | 3.71 | Ex. B-6 | 7.0 | Comp. Ex. B-6 | 9.0 |
| Co | 3.05 | Ex. B-7 | 7.0 | Comp. Ex. B-7 | 8.9 |
| Pd | 3.03 | Ex. B-8 | 7.0 | Comp. Ex. B-8 | 9.0 |
| Be | 3.14 | Ex. B-9 | 7.0 | Comp. Ex. B-9 | 9.0 |
| V | 3.38 | Ex. B-10 | 6.8 | Comp. Ex. B-10 | 8.8 |
| Te | 3.29 | Ex. B-11 | 6.8 | Comp. Ex. B-11 | 8.9 |
| Mo | 3.22 | Ex. B-12 | 6.9 | Comp. Ex. B-12 | 8.8 |

Comparative Examples B-3 to B-12

WORM optical recording media were manufactured as in Examples B-3 to B-12, except that a recording layer was formed using a target in which $Bi_2O_3$ and an oxide of element M listed in the above Table 1B were mixed in a ratio of 2:1 (molar ratio) and fired (that is, a sputtering target in which added element M did not exist as a simple substance).

For the recording layer of the above each comparative examples, when the composition of the recording layer in the thickness direction was quantitatively analyzed by X-ray of 405 nm was 2.21, not satisfying the conditions of the present invention 3, but that for the values of the complex refractive index of the recording layer near a wavelength of 405 nm, the real part was 2.90, and the imaginary part was 0.40, satisfying the conditions of the present invention.

In other words, it was clear that the condition required for an added element usable in the present invention was to enhance a light absorption function for a recording and reproducing laser light, and that as long as this condition was satisfied, for example, even an added element that did not satisfy the conditions of the present invention was used.

INDUSTRIAL APPLICABILITY

The optical recording medium of the present invention has a good sensitivity at a blue laser wavelength or lower, is compatible with high linear velocity recording, and is particularly suitable as a WORM optical recording medium.

A sputtering target and a method for manufacturing a sputtering target according to the present invention can improve the film deposition rate for an improvement in productivity, can increase the packing density, providing a high strength during film deposition, and are used suitably in the manufacture of the recording layer of the optical recording medium of the present invention.

The invention claimed is:

1. An optical recording medium comprising:
   a substrate; and
   a recording layer over the substrate, the recording layer capable of recording and reproduction of information using laser light in a blue wavelength region,
   wherein the recording layer comprises Bi and O as main components, comprises at least any of C and N, and does not comprise Fe,
   wherein in a case that the recording layer comprises C, the proportion of C in the recording layer is 1.5 atomic % to 49 atomic % with respect to the total amount of the recording layer.

2. The optical recording medium according to claim 1, wherein the recording layer further comprises at least one element X selected from B, Li, Sn, Ge, Sr, Mg, Ba, Ca, Mo, W, Co, Si, In, Ti, Mn, Ga, Zr, Cr, Hf, K, Na, Zn, Ni, Cu, Pd, Ag, P, Ta, Y, Nb, Al, V, Sb, Te, and La series elements.

3. The optical recording medium according to claim 2, wherein the element X is B.

4. An optical recording medium comprising:
   a substrate; and
   a recording layer over the substrate, the recording layer comprising as main components Bi oxide and a simple substance of each of one or more elements M (except Bi, C, and N) that enhance a light absorption function for a recording and reproducing laser light,
   wherein the optical recording medium can record and reproduce information using laser light in a blue wavelength region.

5. The optical recording medium according to claim 4, wherein the recording layer further comprises an oxide of the element M.

6. The optical recording medium according to claim 5, wherein the element M is B.

7. The optical recording medium according to claim 5, wherein the element M is at least one selected from Zn, Mg, Ru, Sb, Cr, Be, Co, Pd, V, Te, Ir, Mo, Os, and Rh.

8. A sputtering target comprising:
   Bi oxide; and
   a simple substance of each of one or more elements M (except Bi, C, and N) that enhance a light absorption function for a recording and reproducing laser light of an optical recording medium,
   wherein the Bi oxide and the simple substance are main components.

9. The sputtering target according to claim 8, further comprising an oxide of the element M.

10. The sputtering target according to claim 8, wherein the element M is B.

11. The sputtering target according to claim 8, wherein the element M is at least one selected from Zn, Mg, Ru, Sb, Cr, Be, Co, Pd, V, Te, Ir, Mo, Os, and Rh.

12. The optical recording medium according to claim 4, wherein said simple substance of each of one or more elements M (except Bi, C and N) does not include an oxide of the one or more elements M.

13. The sputtering target according to claim 8, wherein said simple substance of each of one or more elements M (except Bi, C and N) does not include an oxide of the one or more elements M.

* * * * *